United States Patent
Nakada

(10) Patent No.: US 11,647,674 B2
(45) Date of Patent: May 9, 2023

(54) THERMOELECTRIC CONVERSION MATERIAL, THERMOELECTRIC CONVERSION ELEMENT, THERMOELECTRIC CONVERSION MODULE, AND METHOD FOR MANUFACTURING THERMOELECTRIC CONVERSION MATERIAL

(71) Applicant: MITSUBISHI MATERIALS CORPORATION, Tokyo (JP)

(72) Inventor: Yoshinobu Nakada, Ageo (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 163 days.

(21) Appl. No.: 16/498,531

(22) PCT Filed: Jun. 28, 2018

(86) PCT No.: PCT/JP2018/024652
§ 371 (c)(1),
(2) Date: Sep. 27, 2019

(87) PCT Pub. No.: WO2019/004373
PCT Pub. Date: Jan. 3, 2019

(65) Prior Publication Data
US 2020/0044131 A1     Feb. 6, 2020

(30) Foreign Application Priority Data

Jun. 29, 2017 (JP) .............................. JP2017-127097
Jun. 26, 2018 (JP) .............................. JP2018-121096

(51) Int. Cl.
*H01L 35/22* (2006.01)
*H01L 35/34* (2006.01)
(Continued)

(52) U.S. Cl.
CPC .............. *H01L 35/22* (2013.01); *B32B 18/00* (2013.01); *C04B 35/515* (2013.01);
(Continued)

(58) Field of Classification Search
CPC ....... H01L 35/22; H01L 35/34; C04B 35/515; C04B 35/645; C04B 2235/87;
(Continued)

(56) References Cited

U.S. PATENT DOCUMENTS

2003/0209537 A1* 11/2003 Dalton ................. H05B 6/6494
219/634
2012/0097205 A1* 4/2012 Iida ........................ C01B 33/06
136/200
(Continued)

FOREIGN PATENT DOCUMENTS

CN        101503765 A        8/2009
JP        09052764 A    *   2/1997
(Continued)

OTHER PUBLICATIONS

Jianbao Zhao "Thermoelectric and electrical transport properties of Mg2Si multi-doped with Sb, Al and Zn" J. Mater. Chem. A, 2015, 3, 19774 (Year: 2015).*
(Continued)

*Primary Examiner* — Michael Y Sun
(74) *Attorney, Agent, or Firm* — Locke Lord LLP; James E. Armstrong, IV; Nicholas J. DiCeglie, Jr.

(57) ABSTRACT

A thermoelectric conversion material formed of a sintered body containing magnesium silicide as a main component contains 0.5 mass % or more and 10 mass % or less of aluminum oxide. The aluminum oxide is distributed at a crystal grain boundary of the magnesium silicide.

5 Claims, 8 Drawing Sheets

(51) Int. Cl.
*C04B 35/515* (2006.01)
*C04B 35/645* (2006.01)
*B32B 18/00* (2006.01)

(52) U.S. Cl.
CPC ............ *C04B 35/645* (2013.01); *H01L 35/34* (2013.01); *C04B 2235/3217* (2013.01); *C04B 2235/3891* (2013.01); *C04B 2235/402* (2013.01); *C04B 2235/786* (2013.01); *C04B 2235/87* (2013.01)

(58) Field of Classification Search
CPC .... C04B 2235/3891; C04B 2235/3217; C04B 2235/402; C04B 2235/786; C04B 2235/3201; C04B 2235/3203; C04B 2235/3281; C04B 2235/3291; C04B 2235/3294; C04B 2235/3298; C04B 2235/3409; C04B 2235/6588; C04B 2235/663; C04B 2235/72; C04B 35/58085; C04B 37/001; C04B 35/62685; C04B 2235/5436; C04B 2235/6581; C04B 2235/656; C04B 2235/6567; C04B 2235/96; C04B 2237/36; C04B 2237/582; C04B 35/6268; C04B 35/6261; C04B 35/64; C04B 2235/85; C04B 2235/401; C04B 2235/40; C04B 2235/428; C04B 35/58092; B32B 18/00; C22C 1/05; C01B 33/06

See application file for complete search history.

(56) References Cited

U.S. PATENT DOCUMENTS

| 2012/0118343 A1* | 5/2012 | Iida | B22F 3/10 |
| | | | 136/200 |
| 2015/0280099 A1* | 10/2015 | Boukai | H01L 35/32 |
| | | | 136/203 |

FOREIGN PATENT DOCUMENTS

| JP | 2009-188368 A | 8/2009 |
| JP | 2013-179322 A | 9/2013 |
| JP | 2016-164960 A | 9/2016 |
| JP | 2016-207825 A | 12/2016 |
| JP | 2016-213343 A | 12/2016 |
| JP | 2017-050325 A | 3/2017 |
| WO | 2017/159842 A1 | 9/2017 |

OTHER PUBLICATIONS

Isoda, Yukihiro et al., "Effects of Al/Sb Double Doping on the Thermoelectric Properties of Mg2Si0. 75Sn0. 25," Journal of Electronic Materials, 2014.06, vol. 43, No. 6, pp. 2053-2058, <DOI: 10. 1007/s11664-013-2947-7> (cited in the ISR).
International Search Report dated Sep. 18, 2018, issued for PCT/JP2018/024652 and English translation thereof.
Office Action issued in corresponding Chinese Patent Application No. CN 201880013861, dated Nov. 18, 2022, with translation of Search Report.
Office Action issued in corresponding Korean Patent Application No. KR 10-2019-7027584, dated Sep. 26, 2022.

\* cited by examiner (a)

(b) MEASURING POINT A (CRYSTAL GRAIN BOUNDARY)

| Element | Wt% | At% |
|---|---|---|
| OK | 10.15 | 15.47 |
| MgK | 48.37 | 48.5 |
| AlK | 2.37 | 2.14 |
| SiK | 36.73 | 31.88 |
| SbL | 1.04 | 0.21 |
| Matrix | Correction | ZAF |

(c) MEASURING POINT B (INSIDE OF CRYSTAL GRAIN)

| Element | Wt% | At% |
|---|---|---|
| OK | 0.21 | 0.34 |
| MgK | 63.72 | 67.79 |
| AlK | 0.05 | 0.04 |
| SiK | 33.99 | 31.3 |
| SbL | 1.66 | 0.35 |
| Matrix | Correction | ZAF |

THERMOELECTRIC CONVERSION MATERIAL, THERMOELECTRIC CONVERSION ELEMENT, THERMOELECTRIC CONVERSION MODULE, AND METHOD FOR MANUFACTURING THERMOELECTRIC CONVERSION MATERIAL

TECHNICAL FIELD

The present invention relates to a thermoelectric conversion material formed of a sintered body containing magnesium silicide as a main component, a thermoelectric conversion element, a thermoelectric conversion module, and a method for a manufacturing thermoelectric conversion material.

Priority is claimed on Japanese Patent Application No. 2017-127097, filed on Jun. 29, 2017, and Japanese Patent Application No. 2018-121096, filed on Jun. 26, 2018, the content of which is incorporated herein by reference.

BACKGROUND ART

A thermoelectric conversion element formed of a thermoelectric conversion material is an electric element which can convert heat and electricity to each other, that is a Seebeck effect and Peltier effect. The Seebeck effect is an effect of converting thermal energy into electric energy and a phenomenon in which an electromotive force is generated, in a case where a temperature difference on both ends of a thermoelectric conversion material occurs. Such an electromotive force is determined depending on the properties of the thermoelectric conversion material. In recent years, the thermoelectric power generation using this effect has been actively developed.

The thermoelectric conversion element has a structure in which electrodes are respectively formed on one end side and the other end side of the thermoelectric conversion material.

As an index showing properties of such thermoelectric conversion element (thermoelectric conversion material), a power factor (PF) represented by Expression (1) or a dimensionless performance index (ZT) represented by Expression (2) is used, for example. In the thermoelectric conversion material, it is necessary to maintain a temperature difference between one end side and the other end side, and accordingly, low thermal conductivity is preferable.

$$PF = S^2 \sigma \quad (1)$$

Here, S: Seebeck coefficient (V/K), $\sigma$: electrical conductivity (S/m)

$$ZT = S^2 \sigma T/\kappa \quad (2)$$

Here, T=absolute temperature (K), $\kappa$=thermal conductivity (W/(m×K))

For example, as disclosed in Patent Document 1, a material obtained by adding various dopants to magnesium silicide has been proposed, for example, as the thermoelectric conversion material. The thermoelectric conversion material formed of magnesium silicide disclosed in Patent Document 1 is manufactured by sintering raw material powder adjusted to have a predetermined composition.

CITATION LIST

Patent Literature

[Patent Document 1] Japanese Unexamined Patent Application, First Publication No. 2013-179322

DISCLOSURE OF INVENTION

Technical Problem

The power factor (PF) or the dimensionless performance index (ZT) of the thermoelectric conversion material is evaluated by using a peak value at a certain temperature. However, in the thermoelectric conversion element, a high temperature is maintained at one end, and a low temperature is maintained at the other end, and accordingly, a significant thermal gradient occurs in the thermoelectric conversion material. Accordingly, although the power factor (PF) or the dimensionless performance index (ZT) is high at the high temperature side, in a case where the power factor (PF) or the dimensionless performance index (ZT) is low at the low temperature side, the thermoelectric conversion performance over the entire thermoelectric conversion element does not increase. Therefore, a thermoelectric conversion material having a high power factor (PF) and dimensionless performance index (ZT) in a wide temperature range is required.

In addition, in the thermoelectric conversion material containing magnesium silicide as a main component, a part of magnesium silicide may be decomposed, magnesium oxide may be formed, and discoloring may occur, during use under a high temperature condition. In a case where the decomposition has further processed and the formation of magnesium oxide is promoted, the thermoelectric conversion material may be damaged or the thermoelectric conversion material may be peeled off from an electrode, due to a difference in thermal expansion coefficient between magnesium silicide and magnesium oxide. Therefore, durability during use under the high temperature condition is required for the thermoelectric conversion material.

The disclosure is made in circumstances of the problems described above, and an objective thereof is to provide a thermoelectric conversion material that is formed of a sintered body containing magnesium silicide as a main component, has excellent thermoelectric conversion performance in a wide temperature range, and excellent durability during use under a high temperature condition, a thermoelectric conversion element, a thermoelectric conversion module, and a method for a manufacturing thermoelectric conversion material.

Solution to Problem

In order to achieve the above-mentioned objective, there is provided a thermoelectric conversion material of the disclosure formed of a sintered body containing magnesium silicide as a main component, he thermoelectric conversion material comprising 0.5 mass % or more and 10 mass % or less of aluminum oxide, wherein the aluminum oxide is distributed at a crystal grain boundary of the magnesium silicide.

The thermoelectric conversion material having this configuration contains 0.5 mass % or more and 10 mass % or less of aluminum oxide, and the aluminum oxide is distributed at a crystal grain boundary of the magnesium silicide. It is thought that, a part of the aluminum oxide distributed at the crystal grain boundary and Mg which is formed by decomposition of magnesium silicide ($Mg_2Si$) react with each other to generate Al and MgO, grain boundary resistivity decreases due to this Al, and a power factor (PF) and a dimensionless performance index (ZT) can be improved. In addition, it is thought that, a part of Al is diffused also in the crystal grain and replaced with Mg to be introduced to a lattice site, extra electrons are emitted, and resistivity of particles decreases.

Further, it is thought that, oxygen in an atmosphere is prevented from permeating to inside along the crystal grain boundary of the magnesium silicide due to the unreacted aluminum oxide distributed at the grain boundary, and accordingly, it is possible to prevent decomposition of the magnesium silicide and to improve durability during use under a high temperature condition. It is thought that, in a case where particles are exposed to a high temperature in an oxygen atmosphere such as the air atmosphere, Al diffused in the grain is diffused on the surface, and in a case where MgO is formed on the surface, Al is also oxidized and introduced therein, or a dense oxide film of Al is formed and diffusion of oxygen into the element is prevented, thereby oxidization is prevented.

Therefore, the properties become stable under a high temperature condition, a power factor (PF) and a dimensionless performance index (ZT) are high in a wide temperature range, and thermoelectric conversion performance is excellent.

The thermoelectric conversion material of the disclosure may further contain one or more elements selected from a group consisting of Li, Na, K, B, Ga, In, N, P, As, Sb, Bi, Ag, Cu, and Y, as a dopant.

In this case, the thermoelectric conversion material can be a specific semiconductor type, that is, n type thermoelectric conversion material or a p type thermoelectric conversion material.

The thermoelectric conversion material of the disclosure may be formed of the sintered body of magnesium silicide free of a dopant.

In this case, the thermoelectric conversion material is formed of the sintered body of magnesium silicide free of a dopant, and further contains aluminum oxide, and accordingly, a power factor (PF) increases even under a low temperature condition equal to or lower than 300° C., and thermoelectric conversion performance is excellent.

The thermoelectric conversion material of the disclosure may contain aluminum.

In this case, the aluminum is unevenly distributed on the surface, and accordingly, oxidation resistance can be further improved.

In the thermoelectric conversion material of the disclosure, it is preferable that a concentration of aluminum in a crystal grain of the sintered body is 0.005 atom % or more and 0.20 atom % or less.

In this case, the concentration of aluminum is equal to or greater than 0.005 atom %, and accordingly, an effect of decreasing electric resistivity is sufficiently exhibited, and thermoelectric properties can be reliably improved. In addition, oxidation resistance can be reliably improved.

Meanwhile, the concentration of aluminum is equal to or smaller than 0.20 atom %, and accordingly, in a case where a temperature is high exceeding 600° C., for example, it is possible to prevent formation of spherical foreign materials on the surface due to melted aluminum and prevent a deterioration in corrosion resistance of the thermoelectric conversion material.

In the thermoelectric conversion material of the disclosure, a concentration of aluminum in a crystal grain of the sintered body is 0.5 atom % or more and 2 atom % or less. It is preferable that the concentration being obtained by analyzing an inside of the crystal grain of the sintered body with SEM-EDX with an acceleration voltage of 3 kV after heating to 600° C. in a steam atmosphere under pressure of 200 Pa, retaining at 600° C. for 10 minutes, and cooling to 25° C.

In this case, the sintered body is heated to 600° C. in a steam atmosphere under pressure of 200 Pa, maintained at 600° C. for 10 minutes, and cooled to 25° C., and accordingly, a state of oxidation of the thermoelectric conversion material during use in the atmosphere can be evaluated. The concentration of aluminum in the crystal grain is also in the range described above in the sintered body after heating under the condition described above, and accordingly, foreign materials are hardly generated on the surface and oxidation resistance is excellent.

In addition, there is provided a thermoelectric conversion material of the disclosure formed of a sintered body containing magnesium silicide as a main component, wherein the magnesium silicide is $Mg_2Si_xSn_{1-x}$ (0.2<x<0.6), the sintered body contains Sb as a dopant, and a concentration of aluminum in a crystal grain of the sintered body is 0.005 atom % or more and 0.20 atom % or less.

The thermoelectric conversion material having this configuration is formed of a sintered body containing Sb-doped $Mg_2Si_xSn_{1-x}$ (0.2<x<0.6) as a main component, and the concentration of aluminum in a crystal grain of the sintered body is 0.005 atom % or more and 0.20 atom % or less, and accordingly, the PF increases in a low temperature range to a middle temperature range, and thermoelectric conversion efficiency can be improved.

The thermoelectric conversion material of the disclosure has a structure in which a first layer formed of a sintered body of non-doped magnesium silicide and a second layer formed of a sintered body of magnesium silicide containing a dopant are directly bonded to each other, wherein the first layer contains 0.5 mass % or more and 10 mass % or less of aluminum oxide, and the aluminum oxide is distributed at a crystal grain boundary of the magnesium silicide.

In the thermoelectric conversion material having this configuration, the first layer is formed of a sintered body of non-doped magnesium silicide and contains 0.5 mass % or more and 10 mass % or less of aluminum oxide, and accordingly, the PF of the first layer in a low temperature range increases, and thus, the first layer is disposed on a low temperature side and the second layer is disposed on a high temperature side, thereby further improving thermoelectric conversion efficiency.

The matrix has the same configuration, and thus, the first layer and the second layer can be sintered at the same time under the same sintering conditions.

The thermoelectric conversion material of the disclosure may have a configuration in which the second layer contains 0.5 mass % or more and 10 mass % or less of aluminum oxide and the aluminum oxide is distributed at a crystal grain boundary of the magnesium silicide.

In this case, in the second layer, the properties become stable even under a high temperature condition, a power factor (PF) and a dimensionless performance index (ZT) are high in a wide temperature range, and thermoelectric conversion performance is excellent.

In the thermoelectric conversion material of the disclosure, one or both of the first layer and the second layer may contain aluminum.

In this case, aluminum is unevenly distributed on any one or both surfaces of the first layer and the second layer, and oxidation resistance can be further improved.

The thermoelectric conversion material of the disclosure has a structure in which a first layer formed of a sintered body containing magnesium silicide as a main component and a second layer formed of a sintered body of magnesium silicide containing a dopant are directly bonded to each other, wherein the magnesium silicide in the first layer is $Mg_2Si_xSn_{1-x}$ (0.2<x<0.6), the first layer contains Sb as a dopant, and a concentration of aluminum in a crystal grain of the sintered body forming the first layer is 0.005 atom % or more and 0.20 atom % or less.

In the thermoelectric conversion material having this configuration, the first layer is formed of a sintered body containing Sb-doped $Mg_2Si_xSn_{1-x}$ (0.2<x<0.6) and a concentration of aluminum in a crystal grain of the sintered body is 0.005 atom % or more and 0.20 atom % or less, and accordingly, the power factor (PF) of the first layer in a low temperature range increases, and thus, the first layer is disposed on a low temperature side and the second layer is disposed on a high temperature side, thereby further improving thermoelectric conversion efficiency.

There is provided a thermoelectric conversion element of the disclosure, including: the thermoelectric conversion material; and electrodes bonded to one surface and an other opposite surface of the thermoelectric conversion material, respectively.

The thermoelectric conversion element having this configuration includes the thermoelectric conversion material, and accordingly, the power factor (PF) and the dimensionless performance index (ZT) in a wide temperature range are high, and thermoelectric conversion performance is excellent.

There is provided a thermoelectric conversion module of the disclosure, including: the thermoelectric conversion element; and terminals bonded to the electrodes of the thermoelectric conversion element, respectively.

The thermoelectric conversion module having this configuration includes the thermoelectric conversion module described above, and accordingly, the power factor (PF) and the dimensionless performance index (ZT) in a wide temperature range are high, and thermoelectric conversion performance is excellent.

There is provided a thermoelectric conversion module, including: the thermoelectric conversion material including the first layer and the second layer; electrodes bonded to one surface and an other opposite surface of the thermoelectric conversion material, respectively; and terminals bonded to the electrodes, respectively. The first layer is disposed on a low temperature side and the second layer is disposed on a high temperature side.

The thermoelectric conversion module having this configuration includes a first layer having a high power factor (PF) in a low temperature range and a second layer having a high power factor (PF) in a high temperature range. The first layer is disposed on a low temperature side and the second layer is disposed on a high temperature side, and accordingly, the power factor (PF) of the entire thermoelectric conversion material increases, and the thermoelectric conversion performance becomes more excellent.

A method for manufacturing a thermoelectric conversion material of the disclosure is a method for manufacturing a thermoelectric conversion material formed of a sintered body containing magnesium silicide as a main component. This manufacturing method includes a sintering raw material powder formation step of mixing an aluminum oxide powder with a raw material powder containing Mg and Si and obtaining a sintering raw material powder in which an amount of the aluminum oxide powder is set in a range of 0.5 mass % or more and 10 mass % or less; and a sintering step of pressing and heating the sintering raw material powder to form a sintered body.

A raw material powder containing $Mg_2Si$ can be used as the raw material powder containing Mg and Si.

In the method for manufacturing a thermoelectric conversion material having this configuration, the sintering raw material powder containing 0.5 mass % or more and 10 mass % or less of aluminum oxide powder is pressed and heated for sintering, and accordingly, it is possible to obtain a sintered body in which the aluminum oxide is distributed at the grain boundary of the magnesium silicide. In addition, it is possible to obtain a sintered body in which Al generated due to decomposition of a part of aluminum oxide is diffused in the crystal grain. Therefore, it is possible to decrease electric resistance of crystal particles.

In the method for manufacturing a thermoelectric conversion material of the disclosure, the raw material powder used in the sintering raw material powder formation step is made of magnesium silicide containing one or more elements selected from a group consisting of Li, Na, K, B, Ga, In, N, P, As, Sb, Bi, Ag, Cu, and Y as a dopant.

According to the method for manufacturing a thermoelectric conversion material having this configuration, it is possible to manufacture a specific semiconductor type thermoelectric conversion material.

In the method for manufacturing a thermoelectric conversion material of the disclosure, the raw material powder used in the sintering raw material powder formation step is made of magnesium silicide free of a dopant.

According to the method for manufacturing a thermoelectric conversion material having this configuration, it is possible to manufacture a thermoelectric conversion material having a high power factor (PF) even under a low temperature condition equal to or lower than 300° C. and excellent thermoelectric conversion performance.

In the method for manufacturing a thermoelectric conversion material of the disclosure, in the sintering raw material powder formation step, an aluminum powder is further added.

According to the method for manufacturing a thermoelectric conversion material having this configuration, it is possible to manufacture a thermoelectric conversion material having excellent oxidation resistance.

The method for manufacturing a thermoelectric conversion material of the disclosure is a method for manufacturing a thermoelectric conversion material formed of a sintered body containing magnesium silicide as a main component. This manufacturing method includes a sintering raw material powder formation step of mixing an aluminum powder with a raw material powder containing Mg, Si, Sn, and Sb and obtaining a sintering raw material powder in which an amount of the aluminum powder is set in a range of 0.05 mass % or more and 2.0 mass % or less; and a sintering step of pressing and heating the sintering raw material powder to form a sintered body.

In the method for manufacturing a thermoelectric conversion material having this configuration, the sintering raw material powder formed by mixing the aluminum powder with the raw material powder containing Mg, Si, Sn, and Sb in a range of 0.05 mass % or more and 2.0 mass % or less is pressed and heated for sintering, and accordingly, it is possible to manufacture a thermoelectric conversion material formed of a sintered body containing Sb-doped is $Mg_2Si_xSn_{1-x}$ (0.2<x<0.6) and having a concentration of aluminum in a crystal grain of the sintered body of 0.005 atom % or more and 0.20 atom % or less.

In the method for manufacturing a thermoelectric conversion material of the disclosure, arranging a first sintering raw material powder, in which an aluminum oxide powder is mixed with a first raw material powder made of magnesium silicide free of a dopant and an amount of the aluminum oxide powder is set in a range of 0.5 mass % or more and 10 mass % or less, and a second sintering raw material powder, which contains a second raw material powder made of magnesium silicide containing one or more elements selected from a group consisting of Li, Na, K, B, Ga, In, N, P, As, Sb, Bi, Ag, Cu and Y as a dopant, in layers; and producing a thermoelectric conversion material having a structure in which a first layer made of a sintered body of magnesium silicide free of a dopant and a second layer made of a sintered body of magnesium silicide containing a dopant are directly bonded to each other, by heating the first sintering raw material powder and the second sintering raw material powder arranged in layers while pressurizing.

According to the method for manufacturing a thermoelectric conversion material having this configuration, it is possible to manufacture a thermoelectric conversion material having a structure in which a first layer formed of a sintered body of non-doped magnesium silicide and a second layer formed of a sintered body of magnesium silicide containing a dopant are directly bonded to each other. The first sintering raw material powder in which the aluminum oxide powder is mixed with the first raw material powder configured with non-doped magnesium silicide and the amount of the aluminum oxide powder is 0.5 mass % or more and 10 mass % or less, is used, and accordingly, it is possible to form a first layer having a high PF in a low temperature range.

In the method for manufacturing a thermoelectric conversion material of the disclosure, the second sintering raw material powder, in which an aluminum oxide powder is mixed with a second raw material powder and an amount of the aluminum oxide powder is set in a range of 0.5 mass % or more and 10 mass % or less.

In this case, the second layer contains aluminum oxide and properties are stable under a high temperature condition, and accordingly, it is possible to form a second layer having high power factor (PF) and dimensionless performance index (ZT) in a wide temperature range.

In the method for manufacturing a thermoelectric conversion material of the disclosure, preparing a first sintering raw material powder, in which an aluminum powder is mixed with a first raw material powder containing Mg, Si, Sn and Sb and an amount of the aluminum powder is set in a range of 0.05 mass % or more and 2.0 mass % or less, and a second sintering raw material powder, which contains a second raw material powder made of magnesium silicide containing one or more elements selected from a group consisting of Li, Na, K, B, Ga, In, N, P, As, Sb, Bi, Ag, Cu and Y as a dopant, in layers; and producing a thermoelectric conversion material having a structure in which a first layer made of a sintered body of $Mg_2Si_xSn_{1-x}$ (0.2<x<0.6) contains Sb as a dopant and a concentration of aluminum in a crystal grain of the sintered body forming the first layer is 0.005 atom % or more and 0.20 atom % or less, and a second layer made of a sintered body of magnesium silicide containing a dopant are directly bonded to each other by forming a sintered body, by heating one of the first sintering raw material powder and the second sintering raw material powder while pressuring, arranging other of the first sintering raw material powder and the second sintering raw material powder on an obtained sintered body in layers, and heating the other of the first sintering raw material powder and the second sintering raw material powder while pressuring.

According to the method for manufacturing a thermoelectric conversion material having this configuration, it is possible to manufacture a thermoelectric conversion material having a structure in which a first layer that is formed of a sintered body containing Sb-doped $Mg_2Si_xSn_{1-x}$ (0.2<x<0.6) as a main component and in that the concentration of aluminum in a crystal grain of the sintered body is 0.005 atom % or more and 0.20 atom % or less, and a second layer formed of a sintered body of magnesium silicide containing a dopant are directly bonded to each other.

Advantageous Effects of Invention

According to the disclosure, it is possible to provide a thermoelectric conversion material formed of a sintered body containing magnesium silicide as a main component and having excellent thermoelectric conversion performance in a wide temperature range and excellent durability during use under a high temperature condition, a thermoelectric conversion element, a thermoelectric conversion module, and a method for a manufacturing thermoelectric conversion material.

BEST MODE FOR CARRYING OUT THE INVENTION

Hereinafter, a thermoelectric conversion material, a thermoelectric conversion element, a thermoelectric conversion module, and a method for manufacturing a thermoelectric conversion material according to embodiments of the disclosure will be described with reference to accompanying drawings. Each embodiment below are specifically described for easier understanding of a gist of the disclosure and do not limit the disclosure, unless otherwise noted. The drawings used in the following description may have a partially enlarged portion of a main part, for convenience, in order to easily describe the characteristics of the disclosure, and a dimensional ratio or the like of each constituent element may not be the same as the actual one.

First Embodiment

Figure 1:
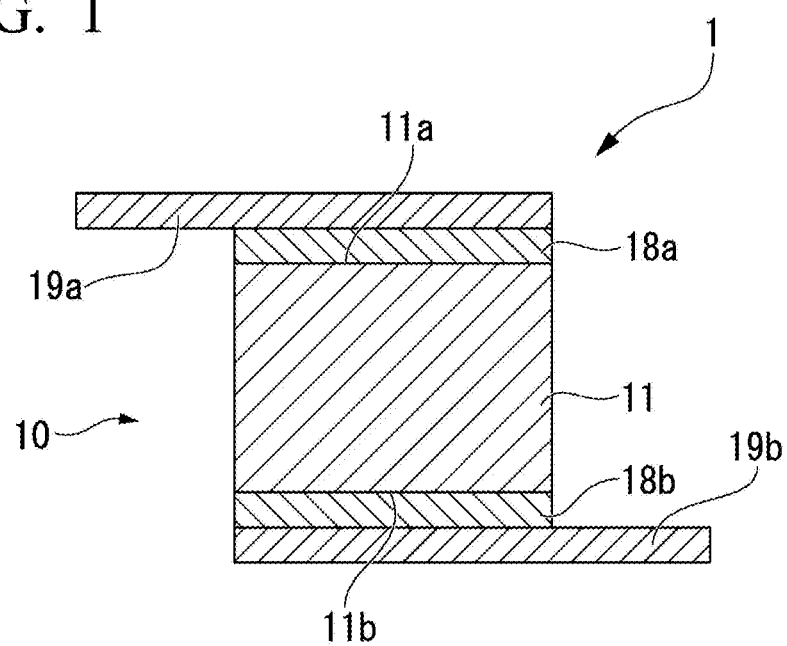
FIG. 1 is a cross-sectional view of a thermoelectric conversion material, a thermoelectric conversion element, and a thermoelectric conversion module according to a first embodiment of the disclosure.

FIG. 1 shows a thermoelectric conversion material 11 according to a first embodiment of the disclosure, and a thermoelectric conversion element 10 and a thermoelectric conversion module using this thermoelectric conversion material 11.

This thermoelectric conversion element 10 includes the thermoelectric conversion material 11 according to the embodiment, and electrodes 18a and 18b formed on one surface 11a and the other opposite surface 11b of this thermoelectric conversion material 11.

The thermoelectric conversion module 1 includes terminals 19a and 19b respectively bonded to the electrodes 18a and 18b of the thermoelectric conversion element 10.

As the electrodes 18a and 18b, nickel, silver, cobalt, tungsten, or molybdenum is used. The electrodes 18a and 18b can be formed by electric sintering, plating, or electrodeposition.

The terminals 19a and 19b are formed of a plate material of a metal material having excellent conductivity, for example, copper or aluminum. In the embodiment, a rolled sheet of aluminum is used. The thermoelectric conversion material (electrodes 18a and 18b) and the terminals 19a and 19b can be bonded by Ag solder or Ag plating.

The thermoelectric conversion material is formed of a sintered body containing magnesium silicide as a main component. The thermoelectric conversion material 11 may be configured with non-doped magnesium silicide not containing a dopant, or may be configured with magnesium silicide containing one or more elements selected from the group consisting of Li, Na, K, B, Ga, In, N, P, As, Sb, Bi, Ag, Cu, and Y, as a dopant.

In the embodiment, the thermoelectric conversion material 11 is a material obtained by adding antimony (Sb) as a dopant is added to magnesium silicide ($Mg_2Si$).

For example, the thermoelectric conversion material 11 of the embodiment has a composition containing a concentration of antimony of 0.1 atom % or more and 2.0 atom % or less to $Mg_2Si$. The thermoelectric conversion material 11 of the embodiment is an n type thermoelectric conversion material having a high carrier density, by adding antimony which is a pentavalent donor.

As the material configuring the thermoelectric conversion material 11, a compound obtained by adding other elements to magnesium silicide such as $Mg_2Si_xGe_{1-x}$ or $Mg_2Si_xSn_{1-x}$ can be used in the same manner.

As a donor for setting the thermoelectric conversion material 11 as the n type thermoelectric conversion element, bismuth, phosphorus, or arsenic other than antimony can be used.

The thermoelectric conversion material 11 may be a p type thermoelectric conversion element, and in this case, this can be obtained by adding a dopant such as lithium or silver as acceptor.

The thermoelectric conversion material 11 according to the embodiment contains aluminum oxide in an amount of 0.5 mass % or more and 10 mass % or less.

The amount of the aluminum oxide in the thermoelectric conversion material 11 is calculated by collecting a measurement sample from the thermoelectric conversion material 11, obtaining Al amount of the thermoelectric conversion material 11 by X-ray fluorescence spectrometry, and performing conversion by assuming the total amount of Al as $Al_2O_3$.

Aluminum of 0.005 atom % or more and 0.20 atom % or less may be contained in the crystal grain of the thermoelectric conversion material 11.

The aluminum contains in a range of 0.005 atom % or more and 0.20 atom % or less, and accordingly, it is possible to prevent oxidation of a surface of the crystal grain and to decrease electric resistance in particles.

The amount of aluminum in the crystal grain was measured with EDX (Genesis series belonged to Quanta450FEG).

In the thermoelectric conversion material 11 according to the embodiment, aluminum oxide is distributed at the crystal grain boundary of magnesium silicide.

Figure 2:
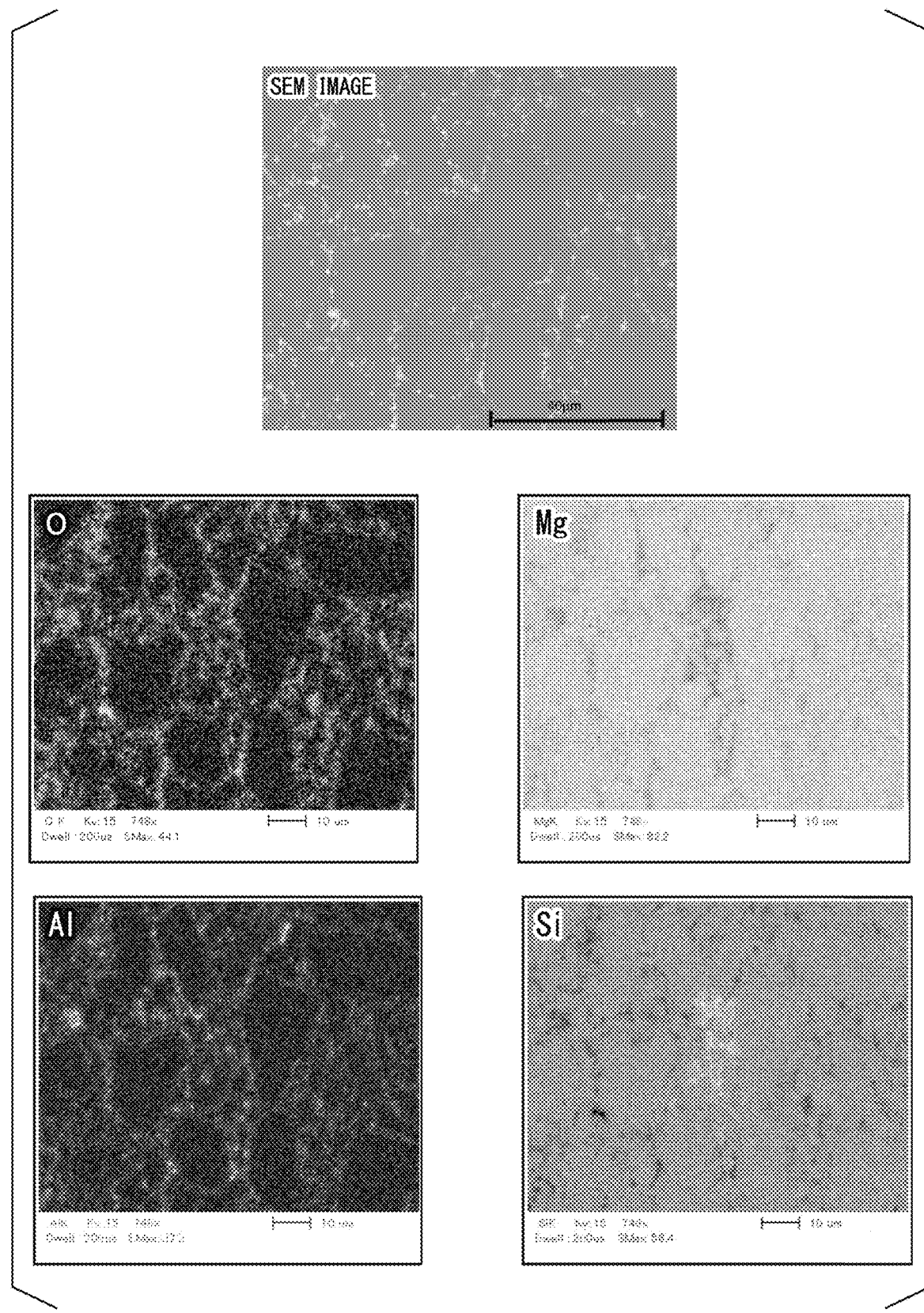
FIG. 2 is an SEM image and element mapping images of the thermoelectric conversion material according to the first embodiment of the disclosure.

FIG. 2 shows an SEM image and element mapping images of the thermoelectric conversion material 11 of the embodiment. In the element mapping images of FIG. 2, it is confirmed that oxygen and aluminum are distributed at the crystal grain boundary of magnesium silicide. It is thought that the aluminum shown in this element mapping image is mainly aluminum oxide.

Figure 3:
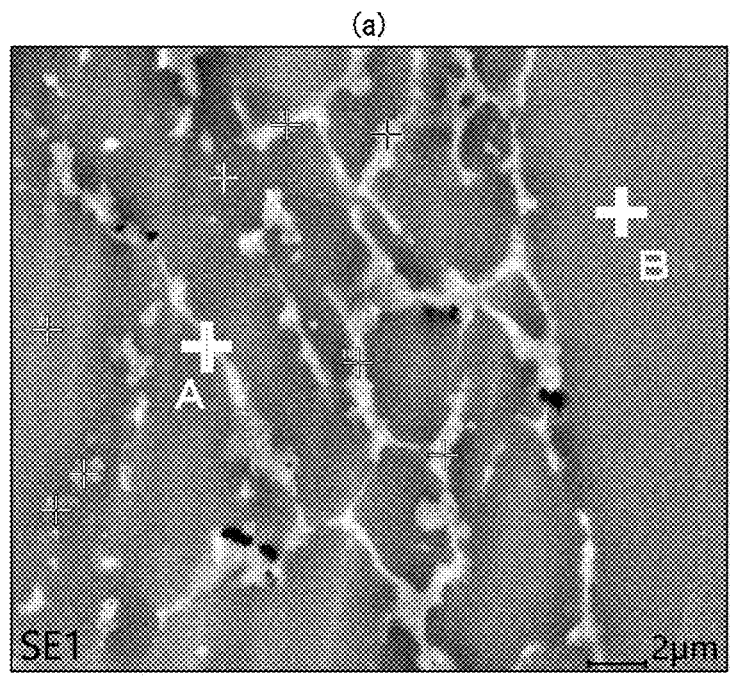
FIG. 3 is an SEM image of the thermoelectric conversion material according to the first embodiment of the disclosure and analysis results of compositions in a crystal grain boundary and in a crystal grain.

FIG. 3 shows an SEM image and analysis results of compositions of the thermoelectric conversion material 11 according to the embodiment. FIG. 3(b) is an analysis result of a region including the crystal grain boundary and FIG. 3(c) is an analysis result of the inside of the crystal grain.

In the thermoelectric conversion material 11 according to the embodiment, it is confirmed that an oxygen concentration and an aluminum concentration in the crystal grain boundary are higher than those in the crystal grain. As shown in FIG. 3(c), a small amount of aluminum is detected in the crystal grain of magnesium silicide. From this viewpoint, in the embodiment, it is thought that aluminum oxide does not have a great effect as a dopant. However, it is thought that a small amount of Al is diffused outward to a surface, in a case where an oxide film of MgO is formed on the surface, a concentration of Al included in the surface layer increases, inward diffusion of oxygen is prevented by formation of oxide of Al, and progress of oxidation is prevented.

As described above, in the thermoelectric conversion material 11 according to the embodiment, the aluminum oxide is distributed at the crystal grain boundary of magnesium silicide. It is thought that, Al is generated due to a reaction between a part of the aluminum oxide and Mg, and Al is present in the crystal grain boundary. It is thought that a part thereof is diffused in the crystal grain. Due to the Al present in the crystal grain boundary, crystal grain resistance is decreased, and a power factor (PF) and a dimensionless performance index (ZT) are improved. In addition, it is thought that, oxygen in an atmosphere is prevented from permeating to inside of the thermoelectric conversion material along the crystal grain boundary due to the aluminum oxide present in the crystal grain boundary, and accordingly, the decomposition of the magnesium silicide is prevented. In the thermoelectric conversion material 11, in the crystal grain boundary that is exposed to the outside and in contact with the atmosphere, Al generated due to a reaction between a part of aluminum oxide and Mg is preferentially oxidized. Accordingly, it is thought that the inward diffusion of the aluminum oxide in oxygen is prevented and the decomposition and oxidation of magnesium silicide are prevented.

In a case where a amount of aluminum oxide is less than 0.5 mass %, the amount of aluminum oxide present in the crystal grain boundary is insufficient, and grain boundary resistance may not be sufficiently decreased. Meanwhile, the aluminum oxide has a thermal conductivity higher than that of magnesium silicide. Accordingly, in a case where the amount of aluminum oxide is greater than 10 mass %, an effect of decreasing the grain boundary resistance is alleviated, the thermal conductivity increases, and the power factor (PF) and the dimensionless performance index (ZT) may decrease, in contrast.

From the viewpoints described above, in the embodiment, the amount of aluminum oxide is regulated to be 0.5 mass % or more and 10 mass % or less.

In order to further decrease the grain boundary resistance, a lower limit of the amount of aluminum oxide is preferably equal to or greater than 1.0 mass % or more preferably equal to or greater than 2.0 mass %.

In order to further prevent an increase in thermal conductivity, an upper limit of the amount of aluminum oxide is preferably equal to or smaller than 7.0 mass % and more preferably equal to or smaller than 5.0 mass %.

The thermoelectric conversion material 11 of the embodiment is heated to 600° C. in a steam atmosphere under pressure of 200 Pa, maintained at 600° C. for 10 minutes, and cooled to 25° C. It is preferable that a concentration of aluminum in a crystal grain of the sintered body which is obtained by analysis of the crystal grain of the sintered body with SEM-EDX with an acceleration voltage of 3 kV is 0.5 atom % or more and 2 atom % or less.

By heating under such conditions, it is possible to assume a state of oxidation during use of the thermoelectric conversion material in the atmosphere, that is, whether the thermoelectric conversion material is a thermoelectric conversion material that is easily oxidized or hardly oxidized.

In a case where a concentration of aluminum in a crystal grain after the heating is equal to or greater than 0.5 atom %, an effect of preventing oxidation can be sufficiently obtained. On the other hand, in a case where a concentration of aluminum in a crystal grain after the heating is equal to or smaller than 2.0 atom %, it is possible to prevent formation of particles having a size greater than MgO containing aluminum as a main component on the surface of the thermoelectric conversion material 11, not only MgO, in a case where the temperature is higher than 600° C., prevent a fragile surface of the thermoelectric conversion material 11, and ensure corrosion resistance.

Figure 4:
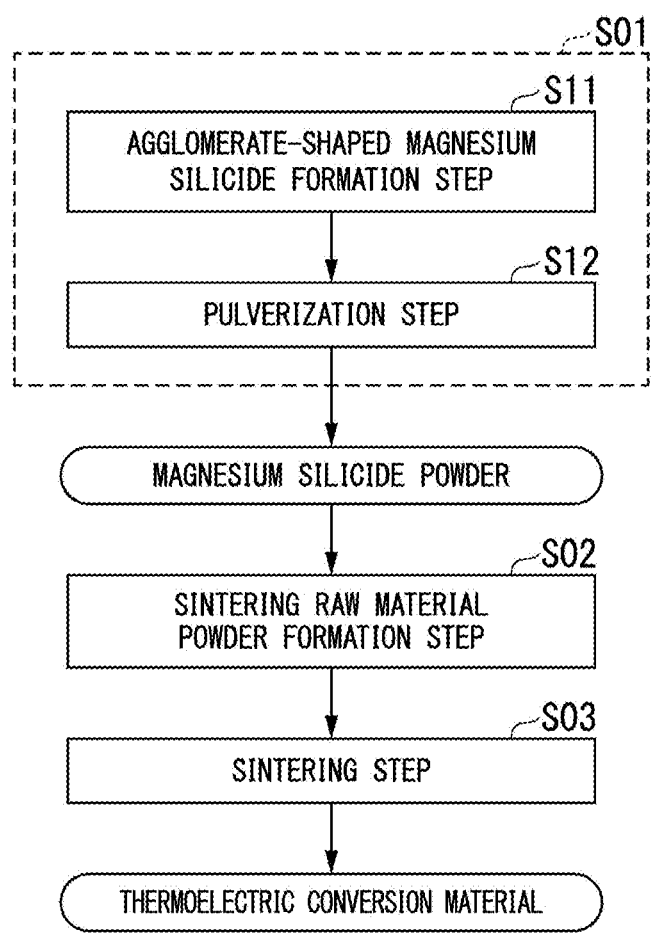
FIG. 4 is a flowchart of a method for manufacturing a thermoelectric conversion material according to the first embodiment of the disclosure.

Hereinafter, a method for manufacturing the thermoelectric conversion material 11 according to the embodiment will be described with reference to FIGS. 4 and 5.

(Magnesium Silicide Powder Preparation Step S01)

First, a powder of magnesium silicide ($Mg_2Si$) to be a matrix of a sintered body which is the thermoelectric conversion material 11 is prepared.

In the embodiment, a magnesium silicide powder preparation step S01 includes an agglomerate-shaped magnesium silicide formation step S11 of obtaining agglomerate-shaped magnesium silicide, and a pulverization step S12 of pulverizing this agglomerate-shaped magnesium silicide ($Mg_2Si$) to obtain a powder.

In the agglomerate-shaped magnesium silicide formation step S11, a silicon powder, a magnesium powder, and a dopant added if necessary, are weighed and mixed with each other. For example, in a case of forming an n type thermoelectric conversion material, a pentavalent material such as antimony or bismuth is mixed as a dopant, and in a case of forming a p type thermoelectric conversion material, a material such as lithium or silver is mixed as a dopant. Non-doped magnesium silicide may be provided, without adding a dopant.

In the embodiment, in order to obtain the n type thermoelectric conversion material, antimony is used as a dopant, and an added amount thereof is 0.1 atom % or more and 2.0 atom % or less.

This powder mixture is, for example, introduced to an alumina crucible, heated to a temperature of 800° C. or more and 1150° C. or less, cooled, and solidified. Accordingly, the agglomerate-shaped magnesium silicide is obtained.

A small amount of magnesium is sublimated during the heating, and accordingly, a large amount of magnesium by 5 atom % is preferably added, for example, regarding a stoichiometric composition of Mg:Si=2:1, at the time of weighing the raw materials.

In the pulverization step S12, the obtained agglomerate-shaped magnesium silicide is pulverized by a pulverizer, and a magnesium silicide powder is formed.

The average grain size of the magnesium silicide powder is preferably 1 μm to 100 μm.

In a case of using commercially available magnesium silicide powder or magnesium silicide powder to which a dopant is added, the agglomerate-shaped magnesium silicide formation step S11 and the pulverization step S12 can be omitted.

(Sintering Raw Material Powder Formation Step S02)

Next, the aluminum oxide powder is added to the obtained magnesium silicide powder, and a sintering raw material powder in which the amount of the aluminum oxide powder is 0.5 mass % or more and 10 mass % or less is obtained.

An average grain size of the aluminum oxide powder is preferably smaller than an average grain size of the magnesium silicide powder. Specifically, the average grain size of the aluminum oxide powder is preferably 0.5 μm or more and 20 μm or less. As the aluminum oxide, for example, a powder of aluminum oxide (α type), aluminum oxide (γ type), or aluminum oxide (molten alumina) can be used.

In addition to the aluminum oxide powder, the aluminum powder may be further added to the obtained magnesium silicide powder.

In a case of adding the aluminum powder, for example, a metal aluminum powder having a purity equal to or greater than 99 mass % and a grain size of 0.5 μm or more and 100 μm or less can be used.

The added amount of aluminum powder is preferably 0.05 mass % or more and 2.0 mass % or less. In this case, it is possible to cause Al to be easily diffused into the crystal grain of the magnesium silicide to more effectively prevent the oxidation of magnesium silicide elements, and to decrease electric resistance of the magnesium silicide crystal particles. In addition, the aluminum that is diffused in the crystal grain of the sintered body is segregated on the crystal grain boundary and contributes to a decrease in electric resistance of the material. Accordingly, the concentration of aluminum in the magnesium silicide grain boundary increases, and the electric resistance of the crystal grain boundary can be decreased.

(Sintering Step S03)

Next, the sintering raw material powder obtained as described above is pressed and heated to obtain a sintered body.

Figure 5:
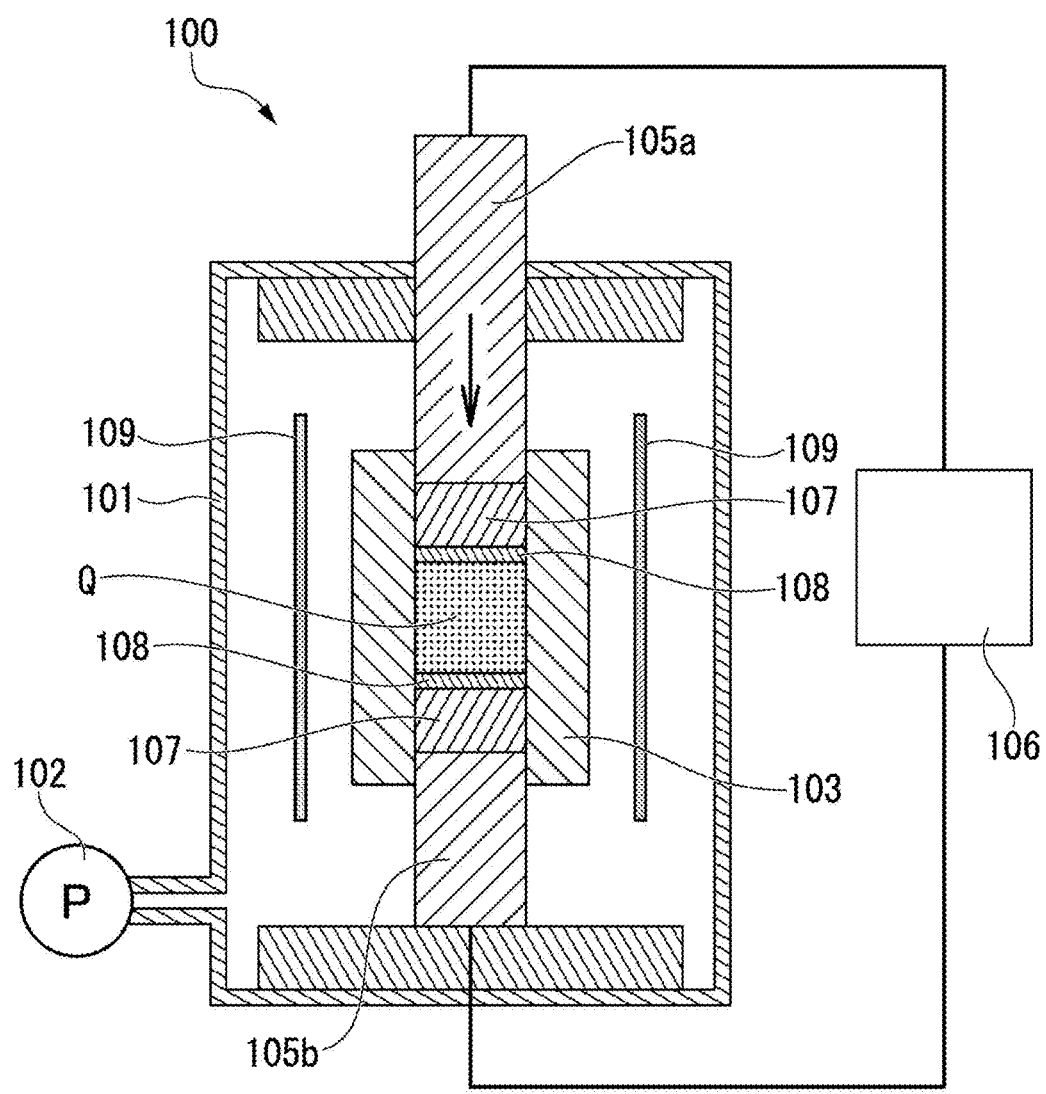
FIG. 5 is a cross-sectional view of a sintering apparatus used in the method for manufacturing a thermoelectric conversion material according to the first embodiment of the disclosure.

In the embodiment, in a sintering step S03, a sintering apparatus (energization sintering apparatus 100) shown in FIG. 5 is used.

The sintering apparatus (energization sintering apparatus 100) shown in FIG. 5, for example, includes a pressure proof housing 101, a vacuum pump 102 which reduces pressure of the inner portion of the pressure proof housing 101, a carbon mold 103 having a hollow cylindrical shape disposed in the pressure proof housing 101, one pair of electrode portions 105a and 105b which apply a current while pressing a sintering raw material powder Q filled in the carbon mold 103, and a power supply device 106 which applies a voltage between the one pair of the electrode portions 105a and 105b. In addition, a carbon plate 107 and a carbon sheet 108 are respectively disposed between the electrode portions 105a and 105b and the sintering raw material powder Q. In addition thereto, a thermometer or a displacement gauge not shown is provided. In the embodiment, heaters 109 are disposed on an outer peripheral side of the carbon mold 103. The heaters 109 are disposed on four side surfaces so as to cover the entire surface on the outer peripheral side of the carbon mold 103. As the heater 109, a carbon heater, a nichrome wire heater, a molybdenum heater, a Kanthal wire heater, or a high frequency heater can be used.

In the sintering step S03, first, the carbon mold 103 of the energization sintering apparatus 100 shown in FIG. 5 is filled with the sintering raw material powder Q. The inner portion of the carbon mold 103 is, for example, covered with a graphite sheet or a carbon sheet. A direct current flows between the one pair of electrode portions 105a and 105b and a current flows to the sintering raw material powder Q by using the power supply device 106, to increase a temperature by self-heating. Among the one pair of electrode portions 105a and 105b, the electrode portion 105a on a movable side is moved towards the sintering raw material powder Q, and the sintering raw material powder Q is pressed between the electrode portion 105a and the electrode portion 105b on a fixed side at a predetermined pressure. The heater 109 is heated.

Accordingly, the sintering raw material powder Q is sintered by the self-heating of the sintering raw material powder Q and heat from the heater 109 and pressure.

In the embodiment, in the sintering condition of the sintering step S03, a sintering temperature of the sintering raw material powder Q is 800° C. or more and 1020° C. or less and a holding time at this sintering temperature is 5 minutes or shorter. A pressing load is 20 MPa or more and 50 MPa or less.

In addition, the atmosphere in the pressure proof housing 101 may be an inert atmosphere such as an argon atmosphere or a vacuum atmosphere. In a case of the vacuum atmosphere, the pressure may be equal to or smaller than 5 Pa.

In a case where the sintering temperature of the sintering raw material powder Q is lower than 800° C., an oxide film formed on the surface of each powder of the sintering raw material powder Q cannot be sufficiently removed, the surface oxide film of the raw material powder remains in the crystal grain boundary, and a density of the sintered body decreases. Accordingly, the resistance of the obtained thermoelectric conversion material may increase.

On the other hand, in a case where the sintering temperature of the sintering raw material powder Q is higher than 1020° C., the decomposition of magnesium silicide progresses in a short period of time, composition deviation is generated, the resistance increases, and a Seebeck coefficient may decrease.

Accordingly, in the embodiment, the sintering temperature of the sintering step S03 is set to be 800° C. or more and 1020° C. or less.

A lower limit of the sintering temperature of the sintering step S03 is preferably equal to or higher than 800° C. and more preferably equal to or higher than 900° C. On the other hand, an upper limit of the sintering temperature of the sintering step S03 is preferably equal to or lower than 1020° C. and more preferably equal to or lower than 1000° C.

In a case where the holding time at the sintering temperature is longer than 5 minutes, the decomposition of magnesium silicide progresses in a short period of time, composition deviation is generated, the resistance increases, and a Seebeck coefficient may decrease.

Accordingly, in the embodiment, the holding time at the sintering temperature of the sintering step S03 is set to be 5 minutes or lower.

An upper limit of the holding time at the sintering temperature of the sintering step S03 is preferably 3 minutes or shorter or more preferably 2 minutes or shorter.

In a case where the pressing load of the sintering step S03 is less than 20 MPa, the density does not increase, and the resistance of the thermoelectric conversion material may increase.

On the other hand, in a case where the pressing load of the sintering step S03 is greater than 50 MPa, a force applied to a carbon jig increases, and the jig may be broken.

Accordingly, in the embodiment, the pressing load of the sintering step S03 is set to be 20 MPa to 50 MPa.

A lower limit value of the pressing load of the sintering step S03 is preferably equal to or greater than 23 MPa and more preferably equal to or greater than 25 MPa. On the other hand, an upper limit value of the pressing load of the sintering step S03 is preferably equal to or smaller than 50 MPa and more preferably equal to or smaller than 45 MPa.

Through the steps described above, the thermoelectric conversion material 11 according to the embodiment is manufactured.

In the sintering step S03 described above, the aluminum oxide powder is present between the powder of the magnesium silicide, and accordingly, the aluminum oxide is distributed at the crystal grain boundary of the magnesium silicide.

In the thermoelectric conversion material 11 according to the embodiment having such a configuration, the aluminum oxide is contained in a range of 0.5 mass % or more and 10 mass % or less, and the aluminum oxide is distributed at the crystal grain boundary of the magnesium silicide. Accordingly, Al is generated due to a reaction between a part of the aluminum oxide distributed at the crystal grain boundary and Mg, the grain boundary resistance decreases due to this Al, and a power factor (PF) and a dimensionless performance index (ZT) can be improved.

According to the thermoelectric conversion material 11 according to the embodiment, it is possible to prevent oxygen in an atmosphere from permeating to inside of magnesium silicide along the crystal grain boundary, by the aluminum oxide distributed at the crystal grain boundary. Accordingly, the decomposition of magnesium silicide is prevented, and durability during use under a high temperature condition can be improved. It is thought that, in the thermoelectric conversion material 11, Al generated due to a reaction between a part of aluminum oxide and Mg is preferentially oxidized, in the crystal grain boundary that is exposed to the outside and in contact with the atmosphere, and the decomposition and oxidation of magnesium silicide are prevented. It is thought that, the decomposed part of Al is diffused in the grain, the inward diffusion of oxygen is prevented by the formation of oxide of Al, and the progress of oxidation is prevented.

Accordingly, the properties of the thermoelectric conversion material 11 according to the embodiment become stable under a high temperature condition, a power factor (PF) and a dimensionless performance index (ZT) are high in a wide temperature range, and thermoelectric conversion performance is excellent.

In the embodiment, in a case where the thermoelectric conversion material 11 contains aluminum in the grain boundary or in the grain, the aluminum can be segregated on a surface, and the oxidation resistance can be further improved.

According to the thermoelectric conversion material 11 according to the embodiment, a dopant is contained, and specifically, a composition containing 0.1 atom % or more and 2.0 atom % or less of antimony in $Mg_2Si$ is provided, and accordingly, an n type thermoelectric conversion material having a high carrier density can be suitably used.

The method for manufacturing a thermoelectric conversion material according to the embodiment includes the sintering raw material powder formation step S02 of mixing the aluminum oxide powder with the powder of magnesium silicide, and obtaining a sintering raw material powder in which the amount of the aluminum oxide powder is 0.5 mass % or more and 10 mass % or less, and the sintering step S03 of pressing and heating the sintering raw material powder to obtain the sintered body, and accordingly, it is possible to obtain a sintered body in which the aluminum oxide is distributed at the crystal grain boundary of magnesium silicide.

Therefore, as described above, it is possible to manufacture the thermoelectric conversion material 11 having high power factor (PF) and dimensionless performance index (ZT) in a wide temperature range and excellent thermoelectric conversion performance.

Second Embodiment

Next, a second embodiment of the disclosure will be described. The same reference numerals are used for the same members as those in the first embodiment, and the specific description is omitted.

Figure 6:
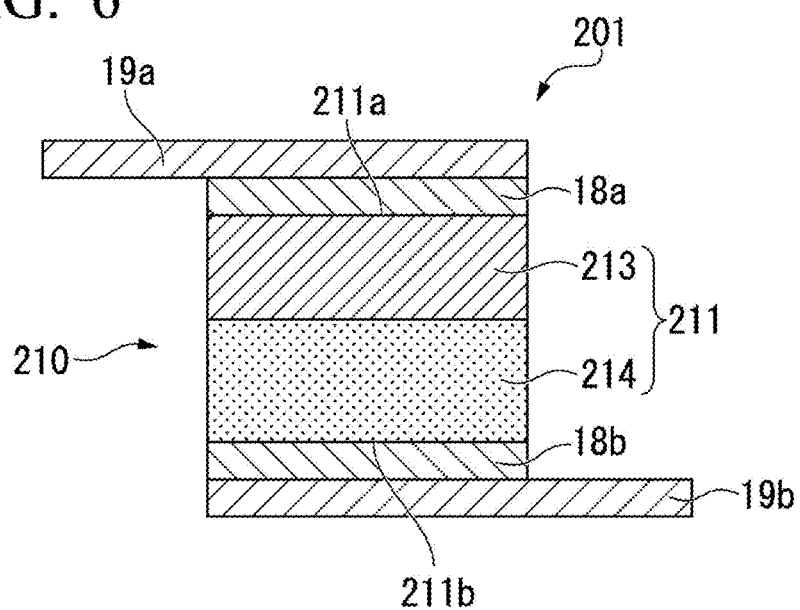
FIG. 6 is a cross-sectional view of a thermoelectric conversion material, a thermoelectric conversion element, and a thermoelectric conversion module according to a second embodiment of the disclosure.

FIG. 6 shows a thermoelectric conversion material 211 according to the second embodiment of the disclosure, a thermoelectric conversion element 210 and a thermoelectric conversion module 201 using this thermoelectric conversion material 211.

This thermoelectric conversion element 210 includes the thermoelectric conversion material 211 according to the embodiment, and electrodes 18a and 18b formed on one surface 211a and the other opposite surface 211b of this thermoelectric conversion material 211.

The thermoelectric conversion module 201 includes terminals 19a and 19b respectively bonded to the electrodes 18a and 18b of the thermoelectric conversion element 210.

The thermoelectric conversion material 211 has a structure in which a first layer 213 formed of a sintered body of non-doped magnesium silicide and a second layer 214 formed of a sintered body of magnesium silicide containing a dopant are directly bonded to each other.

The first layer 213 formed of a sintered body of non-doped magnesium silicide contains 0.5 mass % or more and 10 mass % or less of aluminum oxide, and the aluminum oxide is distributed at the crystal grain boundary of magnesium silicide.

The first layer 213 formed of a sintered body of non-doped magnesium silicide may contain aluminum.

The term, non-doped, means that a dopant of metal element is not intentionally added.

However, as inevitable impurities, for example, a dopant element such as Sb or Bi may be included. In this case, the amount of Sb is preferably less than 0.001 mass % and the amount of Bi is preferably less than 0.001 mass %. In addition to Sb or Bi, an element such as Na, K, B, Ga, In, P, As, Cu, or Y may be contained as the inevitable impurities, and even in this case, the amount of each element is preferably equal to or smaller than 0.01 mass %.

The second layer 214 formed of a sintered body of magnesium silicide containing a dopant contains one or more elements selected from the group consisting of Li, Na, K, B, Ga, In, N, P, As, Sb, Bi, Ag, Cu, and Y, as a dopant. In the embodiment, antimony (Sb) as a dopant is added to magnesium silicide ($Mg_2Si$).

The second layer 214 formed of a sintered body of magnesium silicide containing a dopant may contain 0.5 mass % or more and 10 mass % or less of aluminum oxide and the aluminum oxide may be distributed at the crystal grain boundary of magnesium silicide.

The second layer 214 formed of a sintered body of magnesium silicide containing a dopant may contain aluminum.

As the material configuring the thermoelectric conversion material 211 (first layer 213 and second layer 214), a compound obtained by adding other elements to magnesium silicide such as $Mg_2Si_XGe_{1-X}$ or $Mg_2Si_XSn_{1-X}$ can be used in the same manner.

Figure 7:
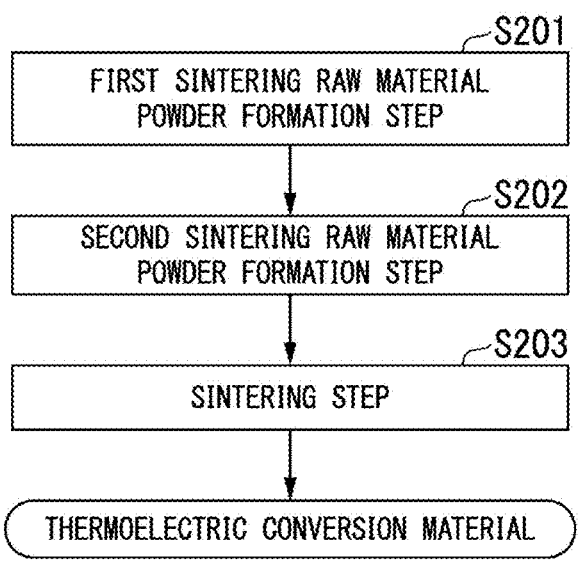
FIG. 7 is a flowchart of a method for manufacturing a thermoelectric conversion material according to the second embodiment of the disclosure.

Hereinafter, a method for manufacturing the thermoelectric conversion material 211 according to the embodiment will be described with reference to FIG. 7.

(First Sintering Raw Material Powder Formation Step S201)

As a raw material of the sintered body which is the first layer 213, a first raw material powder formed of non-doped magnesium silicide ($Mg_2Si$) is manufactured.

First, a silicon powder and a magnesium powder are weighed and mixed with each other. This powder mixture is, for example, introduced to an alumina crucible, heated and decomposed to a temperature of 800° C. or more and 1150° C. or less, cooled, and solidified. Accordingly, the non-doped agglomerate-shaped magnesium silicide is obtained.

The obtained non-doped agglomerate-shaped magnesium silicide is pulverized by a pulverizer, and a first raw material powder formed of non-doped magnesium silicide is formed. An average grain size of the first raw material powder is preferably 1 μm to 100 μm.

Next, the aluminum oxide powder is mixed with the obtained first raw material powder, and a first sintering raw material powder in which the amount of aluminum oxide powder is 0.5 mass % or more and 10 mass % or less is obtained.

The average grain size of the aluminum oxide powder is preferably smaller than the average grain size of the magnesium silicide powder. Specifically, the average grain size of the aluminum oxide powder is preferably 0.5 μm or more and 20 μm or less. As the aluminum oxide, for example, a powder of aluminum oxide (a type), aluminum oxide (y type), or aluminum oxide (molten alumina) can be used.

In addition to the aluminum oxide powder, the aluminum powder may be further added to the obtained first raw material powder.

In a case of adding the aluminum powder, for example, a metal aluminum powder having a purity equal to or greater than 99 mass % and a grain size of 0.5 μm or more and 100 μm or less can be used.

(Second Sintering Raw Material Powder Formation Step S202)

As a raw material of the sintered body which is the second layer 214, a second raw material powder formed of magnesium silicide ($Mg_2Si$) containing one or more elements selected from the group consisting of Li, Na, K, B, Ga, In, N, P, As, Sb, Bi, Ag, Cu, and Y, as a dopant is prepared.

First, a silicon powder, a magnesium powder, and a dopant are weighed and mixed with each other. In the embodiment, antimony is used as a dopant for obtaining an n type thermoelectric conversion material, and an added amount thereof is 0.1 atom % or more and 2.0 atom % or less.

This powder mixture is, for example, introduced to an alumina crucible, heated and dissolved to a temperature of 800° C. or more and 1150° C. or less, cooled, and solidified. Accordingly, agglomerate-shaped magnesium silicide containing a dopant is obtained.

The obtained agglomerate-shaped magnesium silicide containing a dopant is pulverized by a pulverizer, and a second raw material powder (second sintering raw material powder) formed of non-doped magnesium silicide is formed. The average grain size of the second raw material powder is preferably 1 μm or more and 100 μm or less.

The aluminum oxide powder may be mixed with the obtained second raw material powder. At this time, the amount of the aluminum oxide powder is preferably 0.5 mass % or more and 10 mass % or less.

In addition to the aluminum oxide powder, the aluminum powder may be further added to the obtained second raw material powder.

In a case of adding the aluminum powder, for example, the same metal aluminum powder as that in the first sintering raw material powder formation step S201 can be used.

(Sintering Step S203)

Next, a mold die is filled with the first sintering raw material powder and is filled with the second sintering raw material powder so as to be laminated thereon. The laminated first sintering raw material powder and second sintering raw material powder are pressed and heated to obtain a sintered body.

In the embodiment, in the sintering step S203, the sintering apparatus (energization sintering apparatus 100) shown in FIG. 5 is used.

In the embodiment, in the sintering condition of the sintering step S203, a sintering temperature of the first sintering raw material powder and second sintering raw material powder is 800° C. or more and 1020° C. or less and a holding time at this sintering temperature is 5 minutes or shorter. A pressing load is 20 MPa or more and 50 MPa or less.

In addition, the atmosphere in the pressure proof housing 101 may be an inert atmosphere such as an argon atmosphere or a vacuum atmosphere. In a case of the vacuum atmosphere, the pressure may be equal to or smaller than 5 Pa.

Through the steps described above, the thermoelectric conversion material 211 having a structure in which the first layer 213 formed of a sintered body of non-doped magnesium silicide and the second layer 214 formed of a sintered body of magnesium silicide containing a dopant are directly bonded to each other is manufactured.

In the sintering step S203 described above, the aluminum oxide powder is present between the powder of the magnesium silicide, and accordingly, the aluminum oxide is distributed at the crystal grain boundary of the magnesium silicide.

The thermoelectric conversion material 211 according to the embodiment having the configuration described above has a structure in which the first layer 213 formed of a sintered body of non-doped magnesium silicide and the second layer 214 formed of a sintered body of magnesium silicide containing a dopant are directly bonded to each other. The first layer 213 is formed of non-doped magnesium silicide and contains 0.5 mass % or more and 10 mass % or less of aluminum oxide, and accordingly, the PF of the first layer 213, particularly, in a low temperature range (for example, 25° C. to 400° C.) increases. Therefore, the first layer 213 is disposed on a low temperature side, the second layer 214 is disposed on a high temperature side, and accordingly, thermoelectric conversion efficiency can be further improved.

In the embodiment, in a case where the second layer 214 formed of a sintered body of magnesium silicide containing a dopant contains 0.5 mass % or more and 10 mass % or less of aluminum oxide, the aluminum oxide is distributed at the crystal grain boundary of magnesium silicide. Al is generated due to a reaction between a part of the aluminum oxide distributed at the crystal grain boundary and Mg, the grain boundary resistance decreases due to this Al, and a power factor (PF) and a dimensionless performance index (ZT) can be improved.

In the embodiment, in a case where one or both of the first layer 213 and the second layer 214 of the thermoelectric conversion material 211 contains aluminum, the aluminum is unevenly distributed on the surface of one or both of the first layer 213 and the second layer 214, and accordingly, oxidation resistance can be further improved.

The method for manufacturing a thermoelectric conversion material according to the embodiment includes the first sintering raw material powder formation step S201 of forming the first sintering raw material powder including the first raw material powder formed of non-doped magnesium silicide ($Mg_2Si$) and the aluminum oxide powder, the second sintering raw material powder formation step S202 of forming the second sintering raw material powder including the second raw material powder formed of magnesium silicide ($Mg_2Si$) containing one or more elements selected from the group consisting of Li, Na, K, B, Ga, In, N, P, As, Sb, Bi, Ag, Cu, and Y, as a dopant, and the sintering step S203 of pressing and heating the first sintering raw material powder and the second sintering raw material powder filled to be laminated to obtain the sintered body, and accordingly, it is possible to manufacture the thermoelectric conversion material 211 having a structure in which the first layer 213 formed of a sintered body of non-doped magnesium silicide and the second layer 214 formed of a sintered body of magnesium silicide containing a dopant are directly bonded to each other.

Third Embodiment

Next, a third embodiment of the disclosure will be described. The same reference numerals are used for the same members as those in the first embodiment and the second embodiment, and the specific description is omitted.

Figure 8:
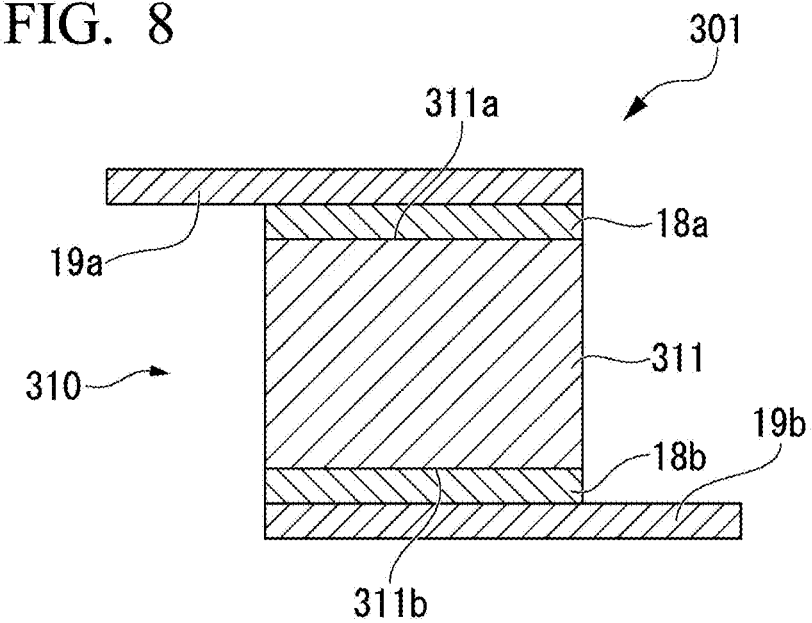
FIG. 8 is a cross-sectional view of a thermoelectric conversion material, a thermoelectric conversion element, and a thermoelectric conversion module according to a third embodiment of the disclosure.

FIG. 8 shows a thermoelectric conversion material 311 according to the third embodiment of the disclosure, a thermoelectric conversion element 310 and a thermoelectric conversion module 301 using this thermoelectric conversion material 311.

This thermoelectric conversion element 310 includes the thermoelectric conversion material 311 according to the embodiment, and electrodes 18a and 18b formed on one surface 311a and the other opposite surface 311b of this thermoelectric conversion material 311.

The thermoelectric conversion module 301 includes terminals 19a and 19b respectively bonded to the electrodes 18a and 18b of the thermoelectric conversion element 310.

The thermoelectric conversion material 311 is formed of a sintered body containing magnesium silicide as a main component. The thermoelectric conversion material 311 contains Sb as a dopant and is configured with $Mg_2Si_xSn_{1-x}$ ($0.2<x<0.6$).

In the sintered body configuring the thermoelectric conversion material 311, a concentration of aluminum in a crystal grain of the sintered body is 0.005 atom % or more and 0.20 atom % or less.

In the embodiment, the concentration of aluminum in the crystal grain can be measured by using EPMA (JXA-8230 manufactured by JEOL, Ltd.).

Figure 9:
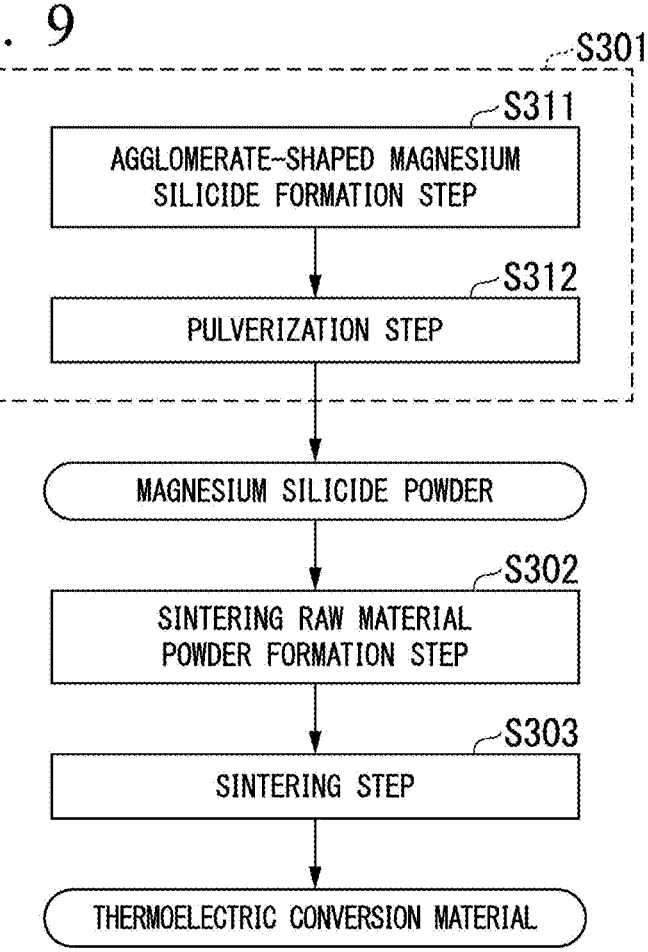
FIG. 9 is a flowchart of a method for manufacturing a thermoelectric conversion material according to the third embodiment of the disclosure.

Hereinafter, a method for manufacturing the thermoelectric conversion material 311 according to the embodiment will be described with reference to FIG. 9.

(Magnesium Silicide Powder Preparation Step S301)

First, a raw material powder containing Mg, Si, Sn, and Sb configuring Sb-containing magnesium silicide (in the embodiment, $Mg_2Si_xSn_{1-x}$) to be a matrix of a sintered body which is the thermoelectric conversion material 311 is prepared.

In the embodiment, a magnesium silicide powder preparation step S301 includes an agglomerate-shaped magnesium silicide formation step S311 of obtaining agglomerate-shaped magnesium silicide, and a pulverization step S312 of pulverizing this agglomerate-shaped magnesium silicide to obtain a powder.

In the agglomerate-shaped magnesium silicide formation step S311, a silicon powder, a magnesium powder, a tin powder, and an antimony powder as a dopant are weighed and mixed with each other. This powder mixture is, for example, introduced to an alumina crucible, heated to a temperature of 700° C. or more and 900° C. or less, cooled, and solidified. Accordingly, the agglomerate-shaped magnesium silicide is obtained. In the embodiment, in order to obtain the n type thermoelectric conversion material, antimony is used as a dopant, and an added amount thereof is 0.1 atom % or more and 2.0 atom % or less.

In the pulverization step S312, the obtained agglomerate-shaped magnesium silicide is pulverized by a pulverizer, and a magnesium silicide powder is formed.

An average grain size of the magnesium silicide powder is preferably 1 µm or more and 100 µm or less.

(Sintering Raw Material Powder Formation Step S302)

Next, the aluminum powder is added to the obtained magnesium silicide powder, and a sintering raw material powder in which the amount of the aluminum powder is 0.05 mass % or more and 2.0 mass % or less is obtained.

An average grain size of the aluminum powder is preferably smaller than an average grain size of the magnesium silicide powder. As the aluminum powder, a metal aluminum powder having a purity equal to or greater than 99 mass % and a grain size of 0.5 µm or more and 100 µm or less is preferable.

(Sintering Step S303)

Next, the sintering raw material powder obtained as described above is pressed and heated to obtain a sintered body.

In the embodiment, in a sintering step S303, a sintering apparatus (energization sintering apparatus 100) shown in FIG. 5 is used.

In the embodiment, in the sintering condition of the sintering step S303, a sintering temperature of the sintering raw material powder Q is 650° C. or more and 850° C. or less and a holding time at this sintering temperature is 5 minutes or shorter. A pressing load is 10 MPa or more and 50 MPa or less.

The atmosphere in the pressure proof housing 101 may be an inert atmosphere such as an argon atmosphere or a vacuum atmosphere. In a case of the vacuum atmosphere, the pressure may be equal to or smaller than 5 Pa.

Through the steps described above, the thermoelectric conversion material 311 according to the embodiment is manufactured.

The thermoelectric conversion material 311 according to the embodiment having such a configuration is formed of a sintered body containing Sb-doped $Mg_2Si_xSn_{1-x}$ ($0.2<x<0.6$) as a main component. The concentration of aluminum in the crystal grain of the sintered body is 0.005 atom % or more and 0.20 atom % or less, and accordingly, the PF increases in a low temperature range to a middle temperature range, and thermoelectric conversion efficiency can be improved. In addition, the aluminum that is diffused in the crystal grain of the sintered body is distributed at the crystal grain boundary.

The method for manufacturing a thermoelectric conversion material according to the embodiment includes the sintering raw material powder formation step S302 of mixing the aluminum powder with the powder of magnesium silicide, and obtaining a sintering raw material powder in which the amount of the aluminum powder is 0.05 mass % or more and 2.0 mass % or less, and the sintering step S303 of pressing and heating the sintering raw material powder to obtain the sintered body, and accordingly, it is possible to obtain a sintered body in which the concentration of aluminum in the crystal grain of magnesium silicide formed of Sb-doped $Mg_2Si_xSn_{1-x}$ ($0.2<x<0.6$) is 0.005 atom % or more and 0.20 atom % or less.

Therefore, as described above, it is possible to manufacture the thermoelectric conversion material 311 having high power factor (PF) and dimensionless performance index (ZT) in a wide temperature range and excellent thermoelectric conversion performance.

Fourth Embodiment

Next, a fourth embodiment of the disclosure will be described. The same reference numerals are used for the same members as those in the first embodiment, the second embodiment, and the third embodiment, and the specific description is omitted.

Figure 10:
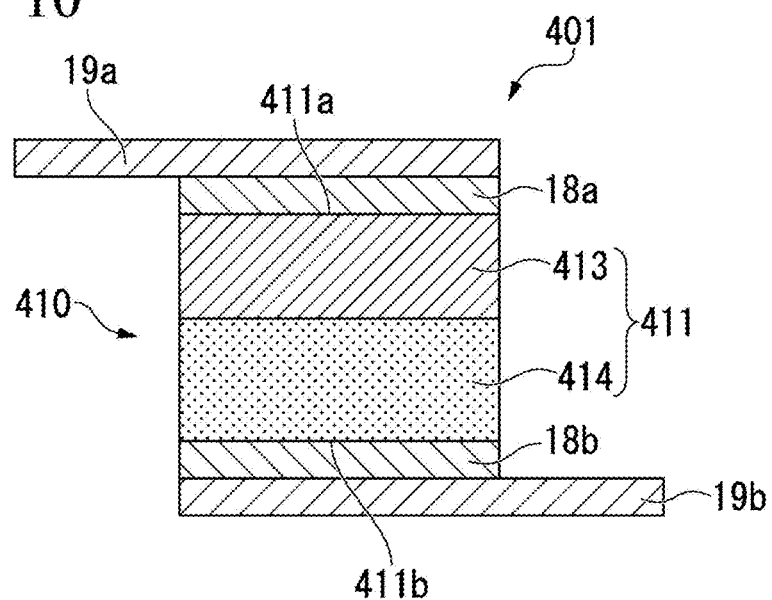
FIG. 10 is a cross-sectional view of a thermoelectric conversion material, a thermoelectric conversion element, and a thermoelectric conversion module according to a fourth embodiment of the disclosure.

FIG. 10 shows a thermoelectric conversion material 411 according to the fourth embodiment of the disclosure, a thermoelectric conversion element 410 and a thermoelectric conversion module 401 using this thermoelectric conversion material 411.

This thermoelectric conversion element 410 includes the thermoelectric conversion material 411 according to the embodiment, and electrodes 18a and 18b formed on one surface 411a and the other opposite surface 411b of this thermoelectric conversion material 411.

The thermoelectric conversion module 401 includes terminals 19a and 19b respectively bonded to the electrodes 18a and 18b of the thermoelectric conversion element 410.

The thermoelectric conversion material 411 has a structure in which a first layer 413 formed of a sintered body of $Mg_2Si_xSn_{1-x}$ (0.2<x<0.6) containing Sb as a dopant and a second layer 414 formed of a sintered body of magnesium silicide containing a dopant are directly bonded to each other.

In the first layer 413, a concentration of aluminum in a crystal grain of the sintered body is 0.005 atom % or more and 0.20 atom % or less.

The second layer 414 formed of a sintered body of magnesium silicide containing a dopant contains one or more elements selected from the group consisting of Li, Na, K, B, Ga, In, N, P, As, Sb, Bi, Ag, Cu, and Y, as a dopant.

The second layer 414 formed of a sintered body of magnesium silicide containing a dopant may contain 0.5 mass % or more and 10 mass % or less of aluminum oxide and the aluminum oxide may be distributed at the crystal grain boundary of magnesium silicide.

The second layer 414 formed of a sintered body of magnesium silicide containing a dopant may contain aluminum.

Figure 11:
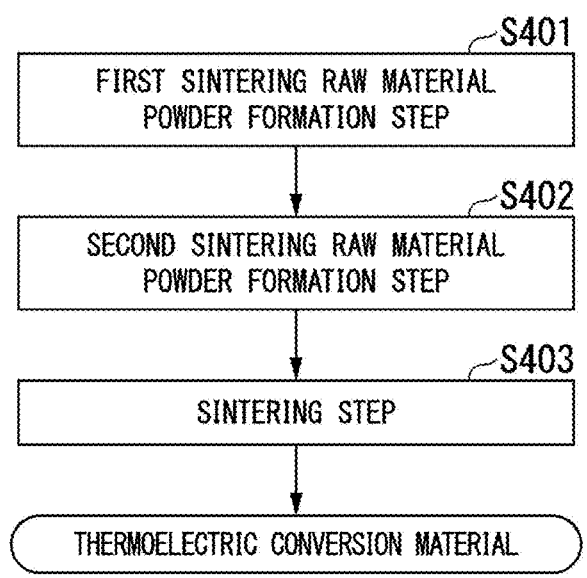
FIG. 11 is a flowchart of a method for manufacturing a thermoelectric conversion material according to the fourth embodiment of the disclosure.

Hereinafter, a method for manufacturing the thermoelectric conversion material 411 according to the embodiment will be described with reference to FIG. 11.

(First Sintering Raw Material Powder Formation Step S401)

As a raw material of the sintered body which is the first layer 413, a first raw material powder formed of $Mg_2Si_xSn_{1-x}$ (0.2<x<0.6) containing Sb as a dopant.

First, a silicon powder, a magnesium powder, a tin powder, and an antimony powder as a dopant are weighed and mixed with each other. This powder mixture is, for example, introduced to an alumina crucible, heated and dissolved to a temperature of 700° C. or more and 850° C. or less, cooled, and solidified. Accordingly, the agglomerate-shaped magnesium silicide is obtained.

The obtained agglomerate-shaped magnesium silicide is pulverized by a pulverizer, and a first raw material powder formed of $Mg_2Si_xSn_{1-x}$ (0.2<x<0.6) containing Sb as a dopant is formed. The average grain size of the first raw material powder is preferably 1 µm to 100 µm. In the embodiment, antimony is used as a dopant for obtaining an n type thermoelectric conversion material, and an added amount thereof is 0.1 atom % or more and 2.0 atom % or less.

Next, the aluminum powder is added to the obtained first raw material powder, and a first sintering raw material powder in which the amount of the aluminum powder is 0.05 mass % or more and 2.0 mass % or less is obtained.

As the aluminum powder, a metal aluminum powder having a purity equal to or greater than 99 mass % and a grain size of 0.5 µm or more and 100 µm or less is preferable.

(Second Sintering Raw Material Powder Formation Step S402)

As a raw material of the sintered body which is the second layer 414, a second raw material powder formed of magnesium silicide containing one or more elements selected from the group consisting of Li, Na, K, B, Ga, In, N, P, As, Sb, Bi, Ag, Cu, and Y, as a dopant is prepared.

First, a silicon powder, a magnesium powder, and a dopant are weighed and mixed with each other. In the embodiment, antimony is used as a dopant for obtaining an n type thermoelectric conversion material, and an added amount thereof is 0.1 atom % or more and 2.0 atom % or less.

This powder mixture is, for example, introduced to an alumina crucible, heated and dissolved to a temperature of 800° C. or more and 1150° C. or less, cooled, and solidified. Accordingly, agglomerate-shaped magnesium silicide containing a dopant is obtained.

The obtained agglomerate-shaped magnesium silicide containing a dopant is pulverized by a pulverizer, and a second raw material powder (second sintering raw material powder) formed of non-doped magnesium silicide is formed. The average grain size of the second raw material powder is preferably 1 µm or more and 100 µm or less.

The aluminum oxide powder may be mixed with the obtained second raw material powder. At this time, the amount of the aluminum oxide powder is preferably 0.5 mass % or more and 10 mass % or less.

In addition to the aluminum oxide powder, the aluminum powder may be further added to the obtained second raw material powder.

In a case of adding the aluminum powder, for example, the same metal aluminum powder as that in the first sintering raw material powder formation step S401 can be used.

(Sintering Step S403)

First, a mold die is filled with the second sintering raw material powder, and the second sintering raw material powder is pressed and heated to obtain a second sintering raw material powder sintered body. In the embodiment, in the sintering step S403, the sintering apparatus (energization sintering apparatus 100) shown in FIG. 5 is used.

Next, a first sintering raw material powder is filed on the sintered body obtained by sintering the second sintering raw material in the molding die, and the laminated first sintering raw material powder is pressed and heated, to obtain a sintered body in which the first sintering raw material powder and the second sintering raw material powder sintered body are directly bonded to each other.

In the embodiment, in the sintering condition of the sintering step S403, a sintering temperature of the first sintering raw material powder is 650° C. or more and 850° C. or less or a sintering temperature of the second sintering raw material powder is 800° C. or more and 1020° C. or less, and a holding time at this sintering temperature is 5 minutes or shorter. The pressing load is 10 MPa or more and 50 MPa or less.

The atmosphere in the pressure proof housing 101 may be an inert atmosphere such as an argon atmosphere or a vacuum atmosphere. In a case of the vacuum atmosphere, the pressure may be equal to or smaller than 5 Pa.

Through the steps described above, the thermoelectric conversion material 411 having a structure in which the first layer 413 formed of a sintered body of $Mg_2Si_xSn_{1-x}$ (0.2<x<0.6) containing Sb as a dopant and a second layer 414 formed of a sintered body of magnesium silicide containing a dopant are directly bonded to each other.

The thermoelectric conversion material 411 according to the embodiment having the configuration described above has a structure in which the first layer 413 formed of a sintered body containing Sb-doped $Mg_2Si_xSn_{1-x}$ (0.2<x<0.6) as a main component, and the second layer 414 formed of a sintered body of magnesium silicide containing a dopant are directly bonded to each other. The first layer 413 is formed of a sintered body containing Sb-doped $Mg_2Si_xSn_{1-x}$ (0.2<x<0.6) as a main component, and the concentration of aluminum in a crystal grain of the sintered body is 0.005 atom % or more and 0.20 atom % or less, and accordingly, the power factor (PF) of the first layer 413, particularly, in a low temperature range (for example, 25° C. to 400° C.) increases. Therefore, the first layer 413 is disposed on a low temperature side, the second layer 414 is disposed on a high temperature side, and accordingly, thermoelectric conversion efficiency can be further improved.

The method for manufacturing a thermoelectric conversion material according to the embodiment includes the first sintering raw material powder formation step S401 of forming the first sintering raw material powder including the first raw material powder formed of $Mg_2Si_xSn_{1-x}$ ($0.2<x<0.6$) containing Sb as a dopant, and the aluminum powder, the second sintering raw material powder formation step S402 of forming the second sintering raw material powder including the second raw material powder formed of magnesium silicide ($Mg_2Si$) containing one or more elements selected from the group consisting of Li, Na, K, B, Ga, In, N, P, As, Sb, Bi, Ag, Cu, and Y, as a dopant, and the sintering step S403 of filling the molding die with the second sintering raw material powder and pressing and heating to obtain the second sintering raw material powder sintered body, filling the first sintering raw material powder on the sintered body obtained by sintering the second sintering raw material in the molding die, and pressing and heating the laminated first sintering raw material powder, to obtain a sintered body in which the first sintering raw material powder and the second sintering raw material powder sintered body are directly bonded to each other. Accordingly, it is possible to manufacture the thermoelectric conversion material 411 having a structure in which the first layer 413 formed of a sintered body containing Sb-doped $Mg_2Si_xSn_{1-x}$ ($0.2<x<0.6$) as a main component, and the second layer 414 formed of a sintered body of magnesium silicide containing a dopant are directly bonded to each other.

Hereinabove, the embodiments of the disclosure have been described, but the disclosure is not limited thereto, and the embodiments can be suitably modified within a range not departing from technical ideals of the disclosure.

For example, in the embodiment, the thermoelectric conversion modules having structures shown in FIGS. 1, 6, 8, and 10 have been described, but there is no limitation thereto, and structures and disposition of electrodes or terminals are not particularly limited, as long as the thermoelectric conversion of the disclosure is used.

In the embodiment, the sintering is performed by using the sintering apparatus (energization sintering apparatus 100) shown in FIG. 5, but there is no limitation thereto, and a method of pressing and sintering a sintering raw material while indirectly heating, for example, hot pressing or HIP may be used.

In the embodiment, the powder of magnesium silicide to which antimony (Sb) is added as a dopant is used as the sintering raw material, but there is no limitation thereto, and for example, one or more elements selected from the group consisting of Li, Na, K, B, Ga, In, N, P, As, Sb, Bi, Ag, Cu, and Y may be contained as a dopant, and these elements may be contained, in addition to Sb.

In addition, a sintered body of non-doped magnesium silicide not containing a dopant may be obtained.

In addition to the powder of magnesium silicide, the powder of silicon oxide may be mixed. As the silicon oxide, $SiO_x$ ($x=1$ to 2) such as amorphous $SiO_2$, cristobalite, quartz, tolydimite, coesite, stashobite, zeiffert stone, and shocked quartz can be used. The mixed amount of silicon oxide is 0.5 mol % or more and 13.0 mol % or less. The mixed amount thereof may be more preferably 0.7 mol % or more and 7 mol % or less. The silicon oxide may have a powder shape having a grain size of 0.5 μmin or more and 100 μm or less.

EXAMPLES

Hereinafter, results of experiments for confirming the effect of the disclosure will be described.

Example 1

Mg having a purity of 99.9 mass % (grain size of 180 μm: manufactured by Kojundo Chemical Lab. Co., Ltd.), Si having a purity of 99.99 mass % (grain size of 300 μm: manufactured by Kojundo Chemical Lab. Co., Ltd.), and Sb having a purity of 99.9 mass % (grain size of 300 μm: manufactured by Kojundo Chemical Lab. Co., Ltd.) were respectively weighed. These powders were thoroughly mixed in a mortar, put into an alumina crucible, and heated in Ar-3 vol % $H_2$ at 850° C. for 2 hours. A large amount of Mg by 5 atom % was mixed by considering a deviation from stoichiometric composition of Mg:Si=2:1 due to the sublimation of Mg. Accordingly, agglomerate-shaped magnesium silicide ($Mg_2Si$) containing 1 atom % of Sb as a dopant was obtained.

Next, this agglomerate-shaped magnesium silicide ($Mg_2Si$) was finely pulverized in a mortar, this was classified, and a magnesium silicide powder ($Mg_2Si$ powder) having an average grain size of 30 μm was obtained.

An aluminum oxide powder ($Al_2O_3$ powder, purity 99.99 mass %, grain size of 1 μm) was prepared, the magnesium silicide powder and the aluminum oxide powder were mixed so as to have the amount shown in Table 1, and a sintering raw material powder was obtained. In Present Disclosure Examples 6 to 9, a metal aluminum powder (grain size of 1 to 5 μm) having a purity of 99.99 mass % was mixed.

A carbon mold having an inner side covered with a carbon sheet was filled with the obtained sintering raw material powder. The energization sintering was performed under the conditions shown in Table 1 by the sintering apparatus (energization sintering apparatus 100) shown in FIG. 5.

Regarding the obtained thermoelectric conversion material, the amount of aluminum oxide, the power factor (PF) and the dimensionless performance index (ZT), and durability during the use under a high temperature condition were evaluated in the following procedures.

(Amount of Aluminum Oxide)

A measurement sample was collected from the obtained thermoelectric conversion material, and the Al amount of the sintered body was measured by X-ray fluorescence spectrometry (scanning type X-ray fluorescence spectrometer ZSX Primus 11 manufactured by Rigaku Corporation). The amount of the aluminum oxide was calculated by assuming a total amount of the measured Al amount of the sintered body as the amount of $Al_2O_3$. The calculation results are shown in Table 1.

(Amount of Aluminum in Crystal Grain)

For the amount of aluminum in the crystal grain, the amount of aluminum in the crystal grain was measured by EDX (Genesis series belonged to Quanta450FEG).

(Power Factor (PF) and Dimensionless Performance Index (ZT))

The power factor (PF) and a dimensionless performance index (ZT) were measured by ZEM-3 manufactured by ADVANCE RIKO, Inc. The measurement was performed twice at each temperature of 100° C., 200° C., 300° C., 400°

C., and 500° C., and an average value thereof was calculated. The evaluation results are shown in Table 2.

(Durability During Use Under High Temperature Condition)

The thermoelectric conversion material was input to a furnace, the pressure was reduced to equal to or smaller than 1.3 kPa, and Ar gas was introduced so that the pressure becomes 11.3 kPa. In this atmosphere (11.3 kPa), a thermal cycle is repeated twice from room temperature to 550° C. A total holding time was 6 to 7 hours.

The measurement sample was collected from the thermoelectric conversion material after the holding, and a film thickness of MgO formed on a surface layer was evaluated by XPS analysis. The film thickness of MgO was calculated from a sputtering time until an intensity of oxygen becomes ½ of that on the outermost surface.

The evaluation results are shown in Table 2.

(Vickers Hardness)

Regarding a part of a sample to which the aluminum oxide is added, and the sample to which the aluminum oxide is not added, a Vickers hardness was measured and the results thereof are shown in Table 2. A Vickers hardness meter used was manufactured by Shimidzu Corporation, a load was set as 3 kg and a holding time was set as 15 seconds.

TABLE 1

| | Sintered body | Amount of aluminum oxide (mass %) | Added amount of aluminum (mass %) | Sintering condition | | | | Amount of aluminum (atom %) |
|---|---|---|---|---|---|---|---|---|
| | | | | Atmosphere | Sintering temperature (° C.) | Holding time (sec) | Pressing load (MPa) | |
| Present Example 1 | Magnesium silicide (Sb-doped) | 0.5 | — | Vacuum | 930 | 30 | 40 | 0.01 |
| Present Example 2 | Magnesium silicide (Sb-doped) | 1.0 | — | Vacuum | 975 | 15 | 20 | 0.03 |
| Present Example 3 | Magnesium silicide (Sb-doped) | 3.0 | — | Vacuum | 970 | 15 | 20 | 0.10 |
| Present Example 4 | Magnesium silicide (Sb-doped) | 6.0 | — | Vacuum | 950 | 30 | 30 | 0.14 |
| Present Example 5 | Magnesium silicide (Sb-doped) | 9.0 | — | Vacuum | 970 | 15 | 20 | 0.15 |
| Present Example 6 | Magnesium silicide (Sb-doped) | 3.0 | 0.05 | Vacuum | 930 | 30 | 40 | 0.10 |
| Present Example 7 | Magnesium silicide (Sb-doped) | 3.0 | 0.10 | Vacuum | 940 | 15 | 40 | 0.11 |
| Present Example 8 | Magnesium silicide (Sb-doped) | 3.0 | 0.50 | Vacuum | 940 | 15 | 40 | 0.12 |
| Present Example 9 | Magnesium silicide (Sb-doped) | 0.5 | 0.50 | Vacuum | 935 | 30 | 40 | 0.09 |
| Comparative Example 1 | Magnesium silicide (Sb-doped) | 0.0 | — | Vacuum | 970 | 60 | 20 | <0.01 |
| Comparative Example 2 | Magnesium silicide (Sb-doped) | 15.0 | — | Vacuum | 975 | 0 | 20 | 0.21 |

TABLE 2

| | PF($\times 10^{-3}$ W/m·K$^2$) | | | | | ZT | | | | | Oxide film thickness after temperature increase and decrease in Ar atmosphere under low pressure* | Vickers hardness (Hv) |
|---|---|---|---|---|---|---|---|---|---|---|---|---|
| | 100° C. | 200° C. | 300° C. | 400° C. | 500° C. | 100° C. | 200° C. | 300° C. | 400° C. | 500° C. | | |
| Present Example 1 | 1.89 | 2.50 | 2.87 | 2.96 | 3.02 | 0.10 | 0.20 | 0.32 | 0.47 | 0.58 | 0.80 | — |
| Present Example 2 | 2.32 | 2.68 | 2.93 | 2.98 | 3.01 | 0.12 | 0.21 | 0.32 | 0.50 | 0.58 | 0.55 | 456 |
| Present Example 3 | 2.82 | 3.32 | 3.54 | 3.63 | 3.41 | 0.14 | 0.25 | 0.38 | 0.58 | 0.66 | 0.25 | 468 |
| Present Example 4 | 2.21 | 2.41 | 2.71 | 2.77 | 2.70 | 0.11 | 0.19 | 0.30 | 0.45 | 0.52 | 0.19 | 470 |
| Present Example 5 | 2.08 | 2.42 | 2.66 | 2.68 | 2.67 | 0.09 | 0.17 | 0.28 | 0.41 | 0.50 | 0.17 | — |
| Present Example 6 | 2.79 | 3.30 | 3.42 | 3.59 | 3.32 | 0.13 | 0.23 | 0.36 | 0.55 | 0.61 | 0.15 | — |
| Present Example 7 | 2.81 | 3.25 | 3.48 | 3.50 | 3.35 | 0.14 | 0.24 | 0.35 | 0.53 | 0.59 | 0.13 | — |
| Present Example 8 | 2.77 | 3.20 | 3.41 | 3.54 | 3.36 | 0.13 | 0.23 | 0.34 | 0.52 | 0.59 | 0.18 | — |
| Present Example 9 | 2.03 | 2.52 | 2.90 | 2.97 | 3.00 | 0.11 | 0.20 | 0.33 | 0.47 | 0.58 | 0.24 | — |
| Comparative Example 1 | 1.29 | 2.04 | 2.49 | 2.56 | 2.60 | 0.07 | 0.16 | 0.28 | 0.40 | 0.50 | 1.00 | 440 |
| Comparative Example 2 | 1.25 | 1.82 | 2.19 | 2.09 | 2.28 | 0.05 | 0.12 | 0.18 | 0.26 | 0.35 | 0.15 | — |

*Relative evaluation in a case where a result in Comparative Example 1 was set as 1.

In Comparative Example 1 in which the aluminum oxide was not contained, and Comparative Example 2 in which the aluminum oxide greater than 10 mass % was contained, the PF and the ZT were low.

With respect to this, in Present Examples 1 to 9 in which the amount of aluminum oxide was 0.5 mass % or more and 10 mass % or less, the PF and the ZT were high. In addition, it was found that an oxide film was hardly formed, compared to Comparative Example 1 in which the aluminum oxide was not contained.

In Present Examples 6 to 9 in which the aluminum was added, it was confirmed that the formation of the oxide film was further prevented.

As shown in Table 2, it was confirmed that, the Vickers hardness increased along an increase in the added amount of the aluminum oxide, and mechanical properties were improved.

From the above viewpoints, according to Present Examples, it was confirmed that it is possible to provide a thermoelectric conversion material having excellent thermoelectric conversion performance in a wide temperature range and excellent durability during the use in a high temperature condition.

Example 2

Mg having a purity of 99.9 mass % (grain size of 180 μm: manufactured by Kojundo Chemical Lab. Co., Ltd.) and Si having a purity of 99.99 mass % (grain size of 300 μm: manufactured by Kojundo Chemical Lab. Co., Ltd.) were respectively weighed. These powders were thoroughly mixed in a mortar, put into an alumina crucible, and heated in Ar-3 vol % $H_2$ at 850° C. for 2 hours. A large amount of Mg by 5 atom % was mixed by considering a deviation from stoichiometric composition of Mg:Si=2:1 due to the sublimation of Mg. Accordingly, non-doped agglomerate-shaped magnesium silicide ($Mg_2Si$) not containing a dopant was obtained.

Next, this agglomerate-shaped magnesium silicide ($Mg_2Si$) was finely pulverized in a mortar, this was classified, and a non-doped magnesium silicide powder ($Mg_2Si$ powder) having an average grain size of 30 μm was obtained.

An aluminum oxide powder ($Al_2O_3$ powder, grain size of 1 μm) was prepared, the magnesium silicide powder and the aluminum oxide powder were mixed so as to have the amount shown in Table 3, and a sintering raw material powder was obtained. In Present Examples 16 to 19, a metal aluminum powder (grain size of 1 to 5 μm) having a purity of 99.99 mass % was mixed.

A carbon mold having an inner side covered with a carbon sheet was filled with the obtained sintering raw material powder. The energization sintering was performed under the conditions shown in Table 3 by the sintering apparatus (energization sintering apparatus 100) shown in FIG. 5.

Regarding the obtained thermoelectric conversion material, the amount of aluminum oxide, the power factor (PF) and the dimensionless performance index (ZT), and durability during the use under a high temperature condition were evaluated in the same procedures as in example 1. The evaluation results are shown in Table 4.

TABLE 3

| | | | | Sintering condition | | | | |
|---|---|---|---|---|---|---|---|---|
| | Sintered body | Amount of aluminum oxide (mass %) | Added amount of aluminum (mass %) | Atmosphere | Sintering temperature (° C.) | Holding time (sec) | Pressing load (MPa) | Amount of aluminum (atom %) |
| Present Example 11 | Magnesium silicide (non-doped) | 0.5 | — | Vacuum | 920 | 15 | 30 | 0.01 |
| Present Example 12 | Magnesium silicide (non-doped) | 1.0 | — | Vacuum | 915 | 15 | 30 | 0.04 |
| Present Example 13 | Magnesium silicide (non-doped) | 3.0 | — | Vacuum | 930 | 15 | 30 | 0.09 |
| Present Example 14 | Magnesium silicide (non-doped) | 5.0 | — | Vacuum | 935 | 15 | 30 | 0.14 |
| Present Example 15 | Magnesium silicide (non-doped) | 8.0 | — | Vacuum | 940 | 15 | 30 | 0.15 |
| Present Example 16 | Magnesium silicide (non-doped) | 1.0 | 0.05 | Vacuum | 915 | 15 | 30 | 0.11 |
| Present Example 17 | Magnesium silicide (non-doped) | 1.0 | 0.10 | Vacuum | 935 | 15 | 30 | 0.11 |
| Present Example 18 | Magnesium silicide (non-doped) | 1.0 | 0.70 | Vacuum | 920 | 15 | 30 | 0.14 |
| Present Example 19 | Magnesium silicide (non-doped) | 0.5 | 0.70 | Vacuum | 980 | 15 | 30 | 0.06 |
| Comparative Example 11 | Magnesium silicide (non-doped) | 0.0 | — | Vacuum | 960 | 15 | 30 | <0.01 |
| Comparative Example 12 | Magnesium silicide (non-doped) | 15.0 | — | Vacuum | 950 | 15 | 30 | 0.23 |

TABLE 4

| | PF($\times 10^{-3}$ W/m·$K^2$) | | | | | ZT | | | | | Oxide film thickness after temperature increase and decrease in Ar atmosphere |
|---|---|---|---|---|---|---|---|---|---|---|---|
| | 100° C. | 200° C. | 300° C. | 400° C. | 500° C. | 100° C. | 200° C. | 300° C. | 400° C. | 500° C. | under low pressure* |
| Present Example 11 | 2.17 | 2.37 | 2.27 | 2.15 | 1.98 | 0.11 | 0.18 | 0.26 | 0.31 | 0.36 | 0.78 |

TABLE 4-continued

| | PF(×10⁻³ W/m·K²) | | | | | ZT | | | | | Oxide film thickness after temperature increase and decrease in Ar atmosphere |
|---|---|---|---|---|---|---|---|---|---|---|---|
| | 100° C. | 200° C. | 300° C. | 400° C. | 500° C. | 100° C. | 200° C. | 300° C. | 400° C. | 500° C. | under low pressure* |
| Present Example 12 | 2.85 | 2.81 | 2.81 | 2.55 | 2.54 | 0.14 | 0.22 | 0.32 | 0.37 | 0.47 | 0.59 |
| Present Example 13 | 2.48 | 2.60 | 2.63 | 2.52 | 2.44 | 0.13 | 0.20 | 0.30 | 0.37 | 0.45 | 0.31 |
| Present Example 14 | 2.37 | 2.51 | 2.52 | 2.47 | 2.37 | 0.12 | 0.19 | 0.29 | 0.36 | 0.44 | 0.22 |
| Present Example 15 | 2.20 | 2.44 | 2.45 | 2.41 | 2.35 | 0.11 | 0.19 | 0.28 | 0.35 | 0.43 | 0.19 |
| Present Example 16 | 2.83 | 2.81 | 2.77 | 2.52 | 2.50 | 0.14 | 0.22 | 0.32 | 0.37 | 0.46 | 0.57 |
| Present Example 17 | 2.79 | 2.71 | 2.73 | 2.48 | 2.47 | 0.14 | 0.21 | 0.31 | 0.36 | 0.45 | 0.50 |
| Present Example 18 | 2.76 | 2.69 | 2.66 | 2.43 | 2.40 | 0.14 | 0.21 | 0.30 | 0.36 | 0.44 | 0.48 |
| Present Example 19 | 2.56 | 2.52 | 2.32 | 2.16 | 2.00 | 0.13 | 0.20 | 0.27 | 0.31 | 0.36 | 0.65 |
| Comparative Example 11 | 0.98 | 0.89 | 0.74 | 0.56 | 0.39 | 0.05 | 0.08 | 0.09 | 0.08 | 0.07 | 1.00 |
| Comparative Example 12 | 1.40 | 1.25 | 1.17 | 1.03 | 1.00 | 0.07 | 0.10 | 0.13 | 0.15 | 0.18 | 0.21 |

*Relative evaluation in a case where a result in Comparative Example 11 was set as 1.

In Comparative Example 11 in which the aluminum oxide was not contained, and Comparative Example 12 in which the aluminum oxide greater than 10 mass % was contained, the PF and the ZT were low.

With respect to this, in Present Examples 11 to 19 in which the amount of aluminum oxide was 0.5 mass % or more and 10 mass % or less, the PF and the ZT were high. In addition, it was found that an oxide film was hardly formed, compared to Comparative Example 11 in which the aluminum oxide was not contained.

In Present Examples 16 to 19 in which the metal aluminum was added, it was confirmed that the formation of the oxide film was further prevented, compared to Present Example 12 in which the metal aluminum was not added.

Example 3

Next, as shown below, a first layer formed of a sintered body of non-doped magnesium silicide and a second layer formed of a sintered body of magnesium silicide containing a dopant were respectively formed.

Mg having a purity of 99.9 mass % (grain size of 180 μm: manufactured by Kojundo Chemical Lab. Co., Ltd.) and Si having a purity of 99.99 mass % (grain size of 300 μm: manufactured by Kojundo Chemical Lab. Co., Ltd.) were respectively weighed. These powders were thoroughly mixed in a mortar, put into an alumina crucible, and heated in Ar-3% $H_2$ at 850° C. for 2 hours. A large amount of Mg by 5 atom % was mixed by considering a deviation from stoichiometric composition of Mg:Si=2:1 due to the sublimation of Mg. Accordingly, non-doped agglomerate-shaped magnesium silicide ($Mg_2Si$) was obtained.

Next, this agglomerate-shaped magnesium silicide ($Mg_2Si$) was finely pulverized in a mortar, this was classified, and a first raw material powder formed of non-doped magnesium silicide ($Mg_2Si$) having an average grain size of 30 m was obtained.

An aluminum oxide powder ($Al_2O_3$ powder, grain size of 1 μm) was prepared, the first raw material powder and the aluminum oxide powder were mixed with each other, and a first sintering raw material powder was obtained.

Mg having a purity of 99.9 mass % (grain size of 180 μm: manufactured by Kojundo Chemical Lab. Co., Ltd.), Si having a purity of 99.99 mass % (grain size of 300 μm: manufactured by Kojundo Chemical Lab. Co., Ltd.), and Sb having a purity of 99.9 mass % (grain size of 300 μm: manufactured by Kojundo Chemical Lab. Co., Ltd.) were respectively weighed. These powders were thoroughly mixed in a mortar, put into an alumina crucible, and heated in Ar-3% $H_2$ at 850° C. for 2 hours. A large amount of Mg by 5 atom % was mixed by considering a deviation from stoichiometric composition of Mg:Si=2:1 due to the sublimation of Mg. Accordingly, non-doped agglomerate-shaped magnesium silicide ($Mg_2Si$) was obtained.

Next, this agglomerate-shaped magnesium silicide ($Mg_2Si$) was finely pulverized in a mortar, this was classified, and a second raw material (second sintering raw material powder) formed of magnesium silicide ($Mg_2Si$) containing a dopant having an average grain size of 30 μm was obtained.

A carbon mold having an inner side covered with a carbon sheet was filled with the obtained first sintering raw material powder and second sintering raw material powder, respectively. The energization sintering was performed by the sintering apparatus (energization sintering apparatus 100) shown in FIG. 5 under the conditions of atmosphere: vacuum, the sintering temperature: 950° C., the holding time: 60 seconds, and the pressing load: 30 MPa.

Regarding the sintered body of non-doped magnesium silicide to be the obtained first layer, and the sintered body of magnesium silicide containing a dopant to be the second layer, the electric resistance value, the Seebeck coefficient, and the power factor (PF) were evaluated. The evaluation results are shown in Table 5.

An electric resistance value R and a Seebeck coefficient S were measured by ZEM-3 manufactured by ADVANCE RIKO, Inc.

The measurement was performed at 100° C., 200° C., 300° C., 400° C., 500° C., and 550° C.

The power factor (PF) was obtained by Expression (3).

$$PF = S^2/R \quad (3)$$

Here, S: Seebeck coefficient (V/K), R: electric resistivity (Ω·m)

TABLE 5

|  |  | 100° C. | 200° C. | 300° C. | 400° C. | 500° C. | 550° C. |
|---|---|---|---|---|---|---|---|
| First layer | Electric resistance (×10⁻⁵ Ω·m) | 1.06 | 1.36 | 1.88 | 2.81 | 2.34 | 2.06 |
|  | Seebeck coefficient (×10⁻⁴ V/K) | −1.74 | −2.00 | −2.30 | −2.67 | −2.44 | −2.32 |
|  | PF (×10⁻³ W/m·K²) | 2.85 | 2.81 | 2.81 | 2.55 | 2.54 | 2.61 |
| Second layer | Electric resistance (×10⁻⁵ Ω·m) | 0.84 | 0.80 | 0.88 | 1.05 | 1.26 | 1.40 |
|  | Seebeck coefficient (×10⁻⁴ V/K) | −1.08 | −1.29 | −1.51 | −1.71 | −1.88 | −1.99 |
|  | PF (×10⁻³ W/m·K²) | 1.38 | 2.10 | 2.58 | 2.79 | 2.80 | 2.83 |

As shown in Table 5, the first layer formed of a sintered body of non-doped magnesium silicide has high PF at 100° C., 200° C., and 300° C. Meanwhile, the second layer formed of a sintered body of magnesium silicide containing a dopant has high PF at 400° C., 500° C., and 550° C.

Accordingly, the first layer is disposed at a low temperature side (100° C.) and the second layer disposed at a high temperature side (500° C.), and accordingly, even in a case where a temperature gradient occurs in the thermoelectric conversion material, a high PF can be obtained over the entire thermoelectric conversion material.

Example 4

Mg having a purity of 99.9 mass % (grain size of 180 μm: manufactured by Kojundo Chemical Lab. Co., Ltd.), Si having a purity of 99.99 mass % (grain size of 300 μm: manufactured by Kojundo Chemical Lab. Co., Ltd.), Sn having a purity of 99.99 mass % (grain size of 38 μm: manufactured by Kojundo Chemical Lab. Co., Ltd.), and Sb having a purity of 99.9 mass % (grain size of 45 μm: manufactured by Kojundo Chemical Lab. Co., Ltd.) were respectively weighed. These powders were thoroughly mixed in a mortar, put into an alumina crucible, and heated in Ar-3 vol % H₂ at 800° C. for 2 hours.

A large amount of Mg by 5 atom % was mixed by considering a deviation from stoichiometric composition of Mg:Si=2:1 due to the sublimation of Mg. Accordingly, antimony-doped agglomerate-shaped magnesium tin silicide (Mg₂SiSn) was obtained.

The concentration of antimony was adjusted to be 0.5 atom %.

Next, this agglomerate-shaped magnesium tin silicide (Mg₂SiSn) was finely pulverized in a mortar, this was classified, and an antimony-doped magnesium silicide powder (Mg₂SiSn) having an average grain size of 30 μm and concentration of 0.5 atom % was obtained.

A metal aluminum powder (Al powder, grain size of 1 to 5 μm) having a purity 99.99 mass % was prepared, the magnesium tin silicide powder and the metal aluminum powder were mixed so as to have the amount shown in Table 6, and a sintering raw material powder was obtained.

A carbon mold having an inner side covered with a carbon sheet was filled with the obtained sintering raw material powder. The energization sintering was performed under the conditions shown in Table 6 by the sintering apparatus (energization sintering apparatus 100) shown in FIG. 5.

Regarding the obtained thermoelectric conversion material, the amount of aluminum, the power factor (PF) and the dimensionless performance index (ZT), and durability during the use under a high temperature condition were evaluated in the same procedures as in example 1. The evaluation results are shown in Tables 6 and 7.

Regarding the aluminum content, the amount of aluminum in the crystal grain was measured by using EPMA (JXA-8230 manufactured by JEOL, Ltd.).

TABLE 6

|  | | Sintering condition | | | |
|---|---|---|---|---|---|
|  | Added amount of aluminum (mass %) | Atmosphere | Sintering temperature (° C.) | Holding time (sec) | Pressing load (MPa) | Amount of aluminum (atom %) |
| Present Example 21 | 1.70 | Vacuum | 725 | 60 | 20 | 0.184 |
| Present Example 22 | 0.54 | Vacuum | 730 | 60 | 20 | 0.098 |
| Present Example 23 | 0.10 | Vacuum | 725 | 60 | 20 | 0.01 |
| Present Example 24 | 0.06 | Vacuum | 735 | 60 | 20 | 0.007 |
| Comparative Example 21 | — | Vacuum | 740 | 20 | 20 | <0.003 |
| Comparative Example 22 | 2.20 | Vacuum | 725 | 60 | 20 | 0.214 |

TABLE 7

| | PF(×10⁻³ W/m·K²) | | | | | | Oxide film thickness after temperature increase and decrease in Ar atmosphere |
|---|---|---|---|---|---|---|---|
| | 50° C. | 100° C. | 200° C. | 300° C. | 400° C. | 450° C. | under low pressure* |
| Present Example 21 | 1.37 | 1.50 | 1.73 | 1.98 | 2.01 | 2.07 | 0.51 |
| Present Example 22 | 1.59 | 1.85 | 2.28 | 2.48 | 2.54 | 2.60 | 0.53 |
| Present Example 23 | 1.72 | 1.91 | 2.33 | 2.52 | 2.54 | 2.51 | 0.68 |
| Present Example 24 | 1.19 | 1.35 | 1.64 | 1.77 | 1.83 | 1.86 | 0.85 |
| Comparative Example 21 | 0.95 | 1.10 | 1.32 | 1.43 | 1.53 | 1.66 | 1.00 |
| Comparative Example 22 | 0.87 | 1.01 | 1.16 | 1.28 | 1.33 | 1.39 | 0.49 |

*Relative evaluation in a case where a result in Comparative Example 21 was set as 1.

In Comparative Example 21 in which aluminum was not added, the PF was relatively low, in a temperature range of 100° C. to 450° C.

In Comparative Example 22 in which 2.20 mass % of aluminum was added, the PF was relatively low, in a temperature range of 100° C. to 450° C.

In contrast, in Present Examples 21 to 24 in which 0.05 mass % or more and 2 mass % or less of aluminum was added, the PF was significantly high, in a temperature range of 100° C. to 450° C.

Example 5

Next, as shown below, a first layer formed of a sintered body of $Mg_2Si_xSn_{1-x}$ (0.2<x<0.6) containing Sb as a dopant and a second layer formed of a sintered body of magnesium silicide containing a dopant were respectively formed.

Mg having a purity of 99.9 mass % (grain size of 180 μm: manufactured by Kojundo Chemical Lab. Co., Ltd.), Si having a purity of 99.99 mass % (grain size of 300 μm: manufactured by Kojundo Chemical Lab. Co., Ltd.), Sn having a purity of 99.99 mass % (grain size of 38 μm: manufactured by Kojundo Chemical Lab. Co., Ltd.), and Sb having a purity of 99.9 mass % (grain size of 45 μm: manufactured by Kojundo Chemical Lab. Co., Ltd.) were respectively weighed. These powders were thoroughly mixed in a mortar, put into an alumina crucible, and heated in Ar-3 vol % $H_2$ at 800° C. for 2 hours.

A large amount of Mg by 5 atom % was mixed by considering a deviation from stoichiometric composition of Mg:Si=2:1 due to the sublimation of Mg. Accordingly, antimony-doped agglomerate-shaped magnesium tin silicide ($Mg_2SiSn$) was obtained.

Next, this agglomerate-shaped magnesium tin silicide ($Mg_2SiSn$) was finely pulverized in a mortar, this was classified, and an antimony-doped magnesium silicide powder ($Mg_2SiSn$) having an average grain size of 30 μm and concentration of 0.5 atom % was obtained.

An aluminum powder (Al powder, grain size of 1 to 5 μm) having a purity 99.99 mass % was prepared, the magnesium tin silicide powder and the aluminum powder were mixed so as to have the amount shown in Table 8, and a first sintering raw material powder was obtained.

Mg having a purity of 99.9 mass % (grain size of 180 μm: manufactured by Kojundo Chemical Lab. Co., Ltd.), Si having a purity of 99.99 mass % (grain size of 300 μm: manufactured by Kojundo Chemical Lab. Co., Ltd.), and Sb having a purity of 99.9 mass % (grain size of 300 μm: manufactured by Kojundo Chemical Lab. Co., Ltd.) were respectively weighed. These powders were thoroughly mixed in a mortar, put into an alumina crucible, and heated in Ar-3% $H_2$ at 850° C. for 2 hours. A large amount of Mg by 5 atom % was mixed by considering a deviation from stoichiometric composition of Mg:Si=2:1 due to the sublimation of Mg. Accordingly, non-doped agglomerate-shaped magnesium silicide ($Mg_2Si$) was obtained.

Next, this agglomerate-shaped magnesium silicide ($Mg_2Si$) was finely pulverized in a mortar, this was classified, and a second raw material (second sintering raw material powder) formed of magnesium silicide ($Mg_2Si$) containing a dopant having an average grain size of 30 μm was obtained.

A carbon mold having an inner side covered with a carbon sheet was filled with the obtained second sintering raw material powder. The energization sintering was performed by the sintering apparatus (energization sintering apparatus 100) shown in FIG. 5 under the conditions of atmosphere: vacuum, the sintering temperature: 950° C., the holding time: 60 seconds, and the pressing load: 30 MPa. The sintered second sintering raw material powder sintered body was put in a carbon mold having an inner side covered with a carbon sheet, and the first sintering raw material powder was filled thereon. The energization sintering was performed by the sintering apparatus (energization sintering apparatus 100) shown in FIG. 5 under the conditions of atmosphere: vacuum, the sintering temperature: 730° C., the holding time: 60 seconds, and the pressing load: 20 MPa.

Regarding the obtained thermoelectric conversion material, the amount of aluminum, the power factor (PF) and the dimensionless performance index (ZT), and durability during the use under a high temperature condition were evaluated in the same procedures as in example 1. The evaluation results are shown in Table 8.

TABLE 8

|  |  | 50° C. | 100° C. | 200° C. | 300° C. | 400° C. | 500° C. | 550° C. |
|---|---|---|---|---|---|---|---|---|
| First layer | PF(×10⁻³ W/m · K²) | 1.72 | 1.91 | 2.33 | 2.52 | 2.54 | — | — |
|  | ZT | 0.29 | 0.39 | 0.64 | 0.86 | 0.90 | — | — |
| Second layer | PF(×10⁻³ W/m · K²) | — | 1.38 | 2.10 | 2.58 | 2.79 | 2.80 | 2.83 |
|  | ZT | — | 0.07 | 0.17 | 0.30 | 0.41 | 0.51 | 0.57 |

As shown in Table 8, the first layer formed of $Mg_2Si_xSn_{1-x}$ (0.2<x<0.6) containing Sb as a dopant and further containing aluminum has high PF at 50° C., 100° C., 200° C., and 300° C. Meanwhile, the second layer formed of a sintered body of magnesium silicide containing a dopant has high PF at 300° C., 400° C., 500° C., and 550° C.

Accordingly, the first layer is disposed at a low temperature side (100° C.) and the second layer disposed at a high temperature side (500° C.), and accordingly, even in a case where a temperature gradient occurs in the thermoelectric conversion material, a high PF can be obtained over the entire thermoelectric conversion material.

Example 6

Samples of Present Examples 31 to 33 and Comparative Example 31 were manufactured from the sample manufactured in Example 1. The composition of the sample correspond to that of Present Examples 1 to 3 and Comparative Example 1 of Table 1.

Regarding the obtained sample, concentration of oxygen, magnesium, aluminum, and silicon in the crystal grain of the surface after oxidation heating, and the surface foreign material formation temperature were measured.

(Concentration of Oxygen, Magnesium, Aluminum, and Silicon in Crystal Grain of Surface after Heating)

A sample piece having a size of 2 mm×2 mm×2 mm was ground with abrasive paper (SiC abrasive grain) No. 1000 and No. 2000, and then ground with abrasive paper ($Al_2O_3$ abrasive grain) No. 4000 and No. 8000, and a mirror was formed. These samples were put to a carbon crucible (inner diameter: 4 mm+, depth: 2 mm), and the temperature was increased to 600° C. in steam atmosphere under pressure of 200 Pa by using SEM-EDX (SEM: Quanta450FEG manufactured by FEI, EDX: Genesis series), and maintained for 10 minutes. After that, after cooling to 25° C., the concentrations of oxygen, magnesium, aluminum, and silicon in the crystal grain were measured by using the SEM-EDX under the condition of an acceleration voltage of 3 kV.

(Surface Foreign Material Formation Temperature)

In the method described above, an SEM image (magnification: 1000 times) was obtained, in a case where the temperature is increased to 600° C., this SEM image was visually confirmed, and the temperature, at which the foreign material is started to be formed on the surface, was set as a formation temperature of the surface foreign material.

The evaluation results are shown in Table 9.

TABLE 9

|  | Sintered body composition | Concentration after heating (atom %) | | | | Surface foreign material formation temperature (° C.) |
|---|---|---|---|---|---|---|
|  |  | O | Mg | Al | Si |  |
| Present Example 31 | $Mg_2Si$(1.0 atom % Sb) + 1 mass % α-$Al_2O_3$ | 12.26 | 65.80 | 1.56 | 20.38 | 504 |
| Present Example 32 | $Mg_2Si$(0.2 atom % Sb) + 3 mass % $Al_2O_3$ | 11.09 | 66.19 | 0.62 | 22.10 | 563 |
| Present Example 33 | $Mg_2Si$(1.0 atom % Sb) + 6 mass % α-$Al_2O_3$ | 11.55 | 66.25 | 1.24 | 20.97 | 482 |
| Comparative Example 31 | $Mg_2Si$(0.5 atom % Sb) | 35.85 | 63.85 | 0.00 | 0.30 | 316 |

In Comparative Example 31 in which the aluminum oxide was not added, and concentration of aluminum in the crystal grain after the heating was less than 0.5 atom %, it was found that, the oxygen concentration and magnesium concentration after the heating were high, and the magnesium oxide was formed and oxidized on the surface of the sample. It was found that, the surface foreign material formation temperature was low, and accordingly, the thermoelectric conversion material that is easily oxidized was obtained.

Meanwhile, in Present Examples 31 to 33 in which the aluminum oxide was added, the concentration of aluminum in the crystal grain after the heating is equal to or greater than 0.5 atom %, and the concentration of oxygen after the heating was low. In addition, it was found that, the surface foreign material formation temperature was high, and accordingly, the thermoelectric conversion material having strong oxidation resistance was obtained. It is thought that the silicon concentration is high in Present Examples 31 to 33, because the oxygen concentration is low, the oxide layer is relatively thin, and accordingly, the silicon element of $Mg_2Si$ configuring the thermoelectric conversion material which is a lower layer of the oxide layer is detected.

From the viewpoints described above, according to Present Examples, it was confirmed that it is possible to provide a thermoelectric conversion material having excellent thermoelectric conversion performance.

INDUSTRIAL APPLICABILITY

According to the disclosure, it is possible to provide a thermoelectric conversion material formed of a sintered body containing magnesium silicide as a main component, and having excellent thermoelectric conversion performance in a wide temperature range and excellent durability during the use in a high temperature condition, a thermoelectric conversion element, a thermoelectric conversion module, and a method for manufacturing this thermoelectric conversion material.

What is claimed is:

1. A thermoelectric conversion element comprising:
   a thermoelectric conversion material formed of a sintered body; and
   electrodes bonded to one surface and an other opposite surface of the thermoelectric conversion material, respectively,
   wherein the sintered body is made of crystal grains and crystal grain boundaries between the crystal grains,
   aluminum oxides are distributed in the crystal grain boundaries among the crystal grains and the crystal grain boundaries,
   an oxygen concentration and an aluminum concentration in the crystal grain boundaries are higher than an oxygen concentration and an aluminum concentration in the crystal grains,
   each of the crystal grains contains magnesium silicide as a main component and aluminum in a range of 0.005 atom % to 0.20 atom %, and
   a converted concentration of the aluminum oxides per the sintered body including the crystal grains and the crystal grain boundaries is 0.5 mass % or more and 10 mass % or less.

2. The thermoelectric conversion element according to claim 1, wherein the thermoelectric conversion material further comprises one or more elements selected from a group consisting of Li, Na, K, B, Ga, In, N, P, As, Sb, Bi, Ag, Cu, and Y, as a dopant.

3. The thermoelectric conversion element according to claim 1, wherein the thermoelectric conversion material is formed of the sintered body of magnesium silicide free of a dopant.

4. The thermoelectric conversion element according to claim 1,
   wherein a concentration of aluminum in a crystal grain of the sintered body is 0.5 atom % or more and 2 atom % or less, the concentration being obtained by analyzing an inside of the crystal grain of the sintered body with SEM-EDX with an acceleration voltage of 3 kV after heating to 600° C. in a steam atmosphere under pressure of 200 Pa, retaining at 600° C. for 10 minutes, and cooling to 25° C.

5. A thermoelectric conversion module comprising:
   the thermoelectric conversion element according to claim 1; and
   terminals bonded to the electrodes of the thermoelectric conversion element, respectively.

* * * * *